(12) United States Patent
Oori

(10) Patent No.: US 8,765,362 B2
(45) Date of Patent: Jul. 1, 2014

(54) PATTERNING METHOD

(71) Applicant: Tomoya Oori, Mie-ken (JP)

(72) Inventor: Tomoya Oori, Mie-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 29 days.

(21) Appl. No.: 13/720,162

(22) Filed: Dec. 19, 2012

(65) Prior Publication Data

US 2014/0065556 A1    Mar. 6, 2014

Related U.S. Application Data

(60) Provisional application No. 61/694,473, filed on Aug. 29, 2012.

(51) Int. Cl.
*G03F 7/20* (2006.01)

(52) U.S. Cl.
USPC ............................................. 430/325

(58) Field of Classification Search
CPC ............... G03F 7/20; G03F 7/22; G03F 7/26
USPC .......................... 430/322, 325, 394
See application file for complete search history.

(56) References Cited

U.S. PATENT DOCUMENTS

| 7,935,553 | B2 | 5/2011 | Scheuerlein et al. |
|---|---|---|---|
| 2007/0218673 | A1 | 9/2007 | Nakamura |
| 2010/0202181 | A1 | 8/2010 | Hashimoto et al. |

FOREIGN PATENT DOCUMENTS

| JP | 2006-294942 | 10/2006 |
|---|---|---|
| JP | 2011-258822 | 12/2011 |

OTHER PUBLICATIONS

Shinji Tarutani et al. "Functional resist materials for negative tone development in advanced lithography", Proc. of SPIE vol. 8325, Feb. 2012, pp. 1-8.

*Primary Examiner* — Brittany Raymond
(74) *Attorney, Agent, or Firm* — Oblon, Spivak, McClelland, Maier & Neustadt, L.L.P.

(57) ABSTRACT

According to one embodiment, a patterning method includes exposure-transferring a plurality of first island pattern images and a plurality of second island pattern images onto a resist film, each of the plurality of first island pattern images having a configuration having a contour line or a major axis extending in a third direction, the plurality of first island pattern images having a staggered arrangement, each of the plurality of second island pattern images having a configuration having a contour line or a major axis extending in a fourth direction, the plurality of second island pattern images having a staggered arrangement, the first island pattern images and the second island pattern images being continuous in the first direction by a portion of each of the second island pattern images overlapping one of the first island pattern images.

20 Claims, 20 Drawing Sheets

PATTERNING METHOD

CROSS-REFERENCE TO RELATED APPLICATION

This application is based upon and claims the benefit of priority from U.S. Provisional Patent Application 61/694,473, filed on Aug. 29, 2012; the entire contents of which are incorporated herein by reference.

FIELD

Embodiments described herein relate generally to a patterning method.

BACKGROUND

In recent years, line-and-space patterns formed in, for example, semiconductor memory devices have increasingly narrow pitches. In lithography technology, it is more difficult to downscale a contact hole pattern than a line-and-space pattern; and it is becoming difficult to form contact hole patterns with the same pitch as narrow-pitch line-and-space patterns.

DETAILED DESCRIPTION

Figure 1A:
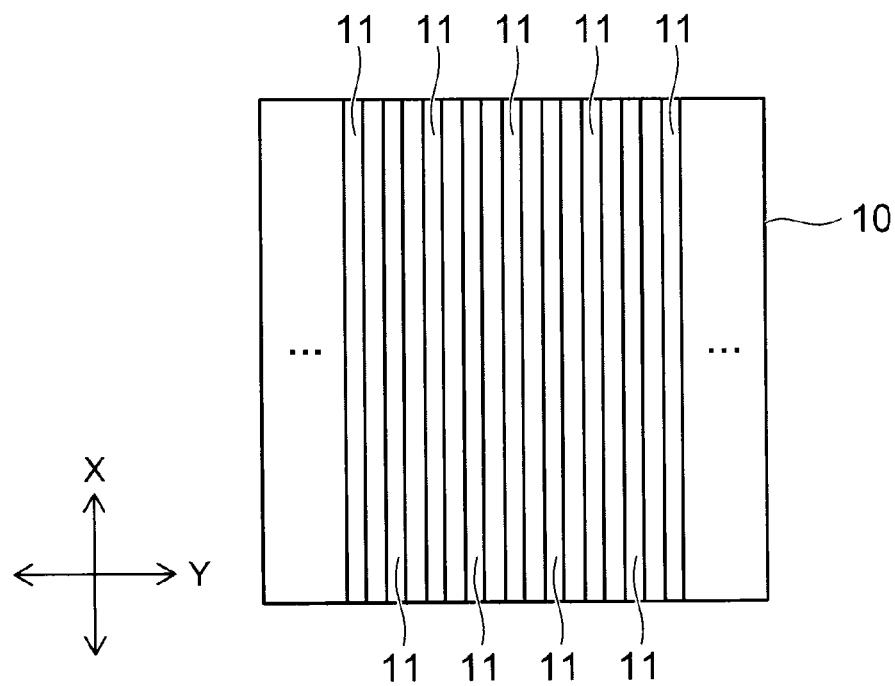
FIGS. 1A to 3 are schematic plan views showing a patterning method of a first embodiment.

According to one embodiment, a patterning method includes exposure-transferring a plurality of first island pattern images and a plurality of second island pattern images onto a resist film formed above a plurality of line patterns extending in a first direction and arranged in a second direction orthogonal to the first direction, each of the plurality of first island pattern images having a configuration having a contour line or a major axis extending in a third direction tilted with respect to the first direction and the second direction, the plurality of first island pattern images having a staggered arrangement, each of the plurality of second island pattern images having a configuration having a contour line or a major axis extending in a fourth direction tilted with respect to the first direction and the second direction, the plurality of second island pattern images having a staggered arrangement, the first island pattern images and the second island pattern images being continuous in the first direction by a portion of each of the second island pattern images overlapping one of the first island pattern images. The patterning method includes developing the resist film to make a plurality of holes respectively in regions where the first island pattern images and the second island pattern images overlap, the plurality of holes being positioned above the line patterns, a pitch of the plurality of holes in the second direction being larger than a pitch of the plurality of line patterns in the second direction.

Embodiments will now be described with reference to the drawings. Similar components in the drawings are marked with like reference numerals.

Figure 19A:
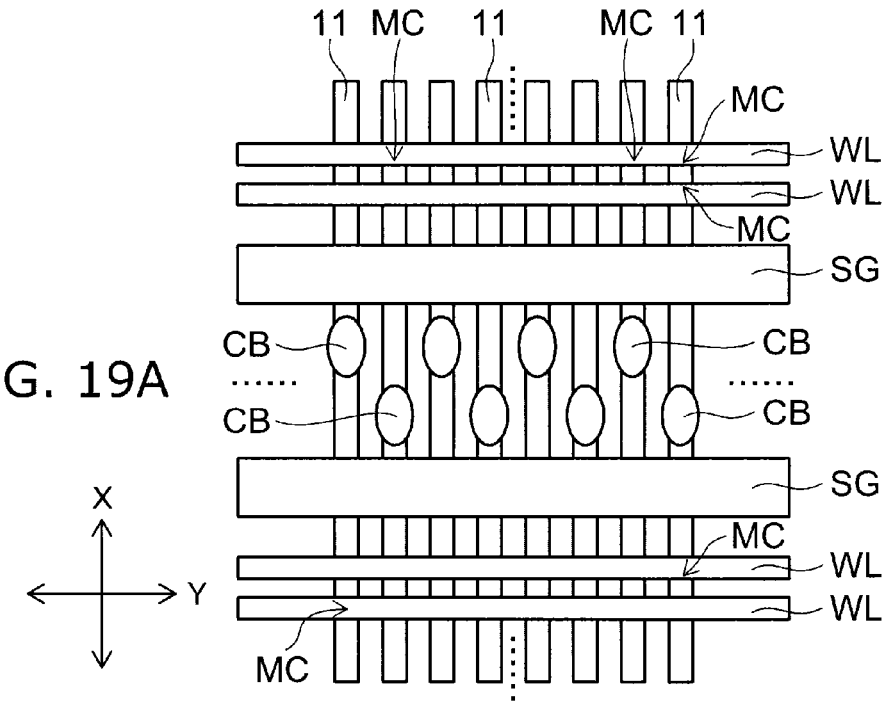
FIGS. 19A and 19B are schematic plan views of a bit line contact region of a semiconductor memory device.

FIGS. 19A and B are schematic plan views of the bit line contact region of a semiconductor memory device.

Multiple active regions 11 extending in an X direction (a first direction) and arranged in a Y direction (a second direction) orthogonal to the X direction are formed as line patterns on the substrate.

Multiple word line patterns WL extending in the Y direction and arranged in the X direction to cross the multiple active regions 11 are formed on the active regions 11. The word line pattern WL includes, a charge storage layer such as a floating electrode, a trap insulating film and the like, and a control electrode.

Memory cells MC are provided at the intersections between the word line patterns WL and the active regions 11; and multiple memory cells MC are arranged in a matrix configuration.

The multiple memory cells MC arranged in the X direction form a cell column that is connected in series via the active region 11. A pair of select gates SG is formed between cell columns adjacent to each other in the X direction to respectively correspond to the cell columns. The select gates SG extend in the Y direction to cross the multiple active regions 11.

The select gates SG shown in FIGS. 19A and B are bit line-side select gates SG for connecting the active regions 11 to not-shown bit lines. Although not-shown, source line-side select gates for connecting the cell columns to source lines are formed at the other end portions of the cell columns.

Bit line contacts CB are formed respectively on the active regions 11 in the region between the pair of select gates SG; and the active regions 11 are connected respectively to the bit lines of a not-shown upper layer via the bit line contacts CB.

In recent years, line-and-space having a pitch that is narrower and a line width that is finer than those possible by lithography by an exposure apparatus is being formed as the active regions 11 by the application of, for example, a sidewall transfer process.

However, it is becoming difficult to align and expose the micro contact holes with high precision on the active regions 11 having line widths not more than the resolution limit of the exposure apparatus.

In other words, a micro size beyond the resolution limit of the exposure apparatus is necessary for the pattern formation of the bit line contacts CB as well; and, for example, a double exposure method has been proposed.

As the patterning method of the embodiments, a formation method of a bit line contact pattern of a semiconductor memory device will now be described.

First Embodiment

FIG. 1A to FIG. 3 are schematic plan views showing a patterning method of a first embodiment.

FIG. 1A to FIG. 3 show the region between the select gates SG of FIGS. 19A and B.

As shown in FIG. 1A, the multiple active regions 11 are formed as line patterns on, for example, a substrate 10 which is a silicon substrate. The active regions 11 are formed at the surface of the substrate 10 or at the surface of a semiconductor well layer that is formed at the surface of the substrate 10 to function as channel regions of the memory device.

The multiple active regions 11 extending in the X direction (the first direction) are arranged in the Y direction (the second direction) orthogonal to the X direction.

Figure 1B:
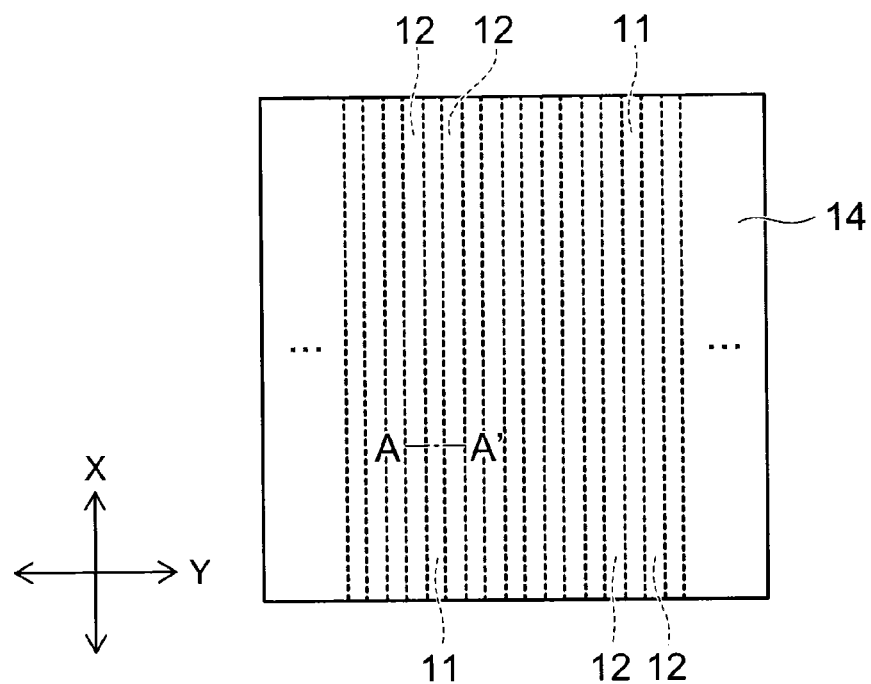

As shown in FIG. 1B, a resist film 14 is formed on the multiple active regions 11.

Figure 18A:
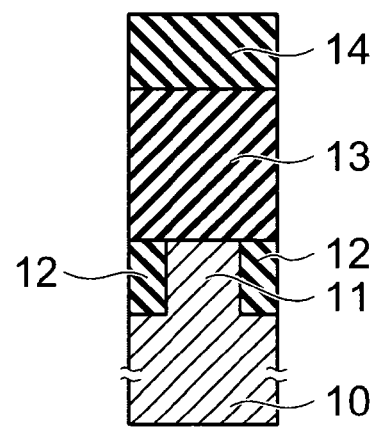
FIGS. 18A to 18C are schematic cross-sectional views showing a forming method of a contact portion of an embodiment.

FIG. 18A is a schematic enlarged cross-sectional view of line A-A' of FIG. 1B.

The active regions 11 are formed in fin configurations on the substrate 10; and the active regions 11 adjacent to each other in the Y direction are insulatively separated by, for example, an insulative separating film 12 having a STI (shallow trench isolation) structure.

An inter-layer film 13 is formed on the active regions 11 and on the insulative separating film 12; and the resist film 14 is formed on the inter-layer film 13. The resist film 14 is not limited to a single-layer film and may have a multiple-film structure.

Figure 2A:
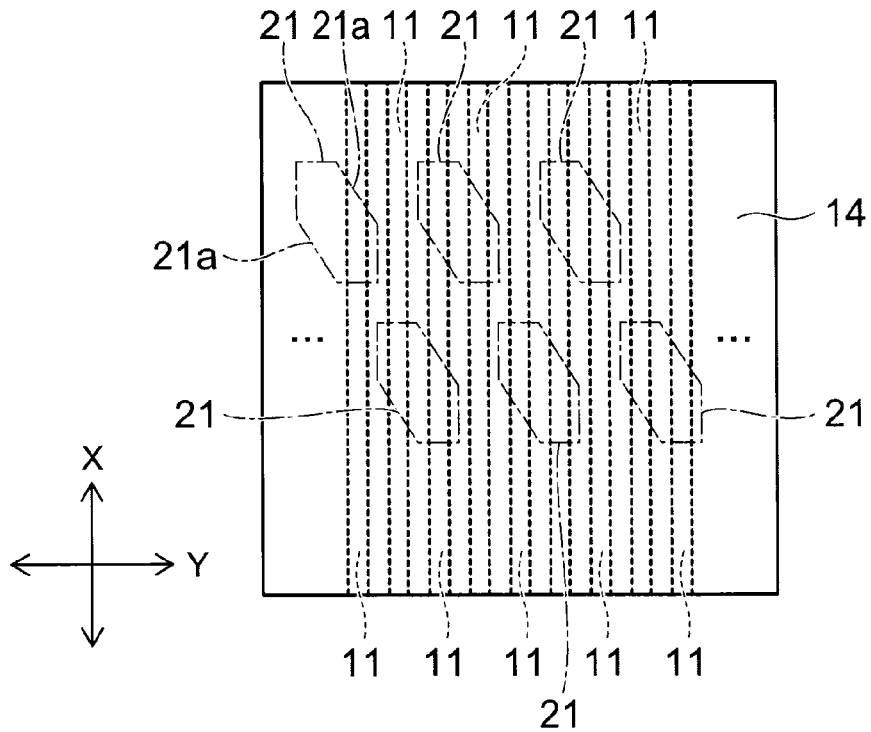

As shown in FIG. 2A, the multiple first island pattern images (the latent images) 21 are exposure-transferred onto the resist film 14 by lithography using a not-shown mask (reticle).

The multiple first island pattern images 21 have two columns of the multiple first island pattern images 21 arranged in the Y direction; and the Y-direction positions of the columns are shifted from each other. In other words, the multiple first island pattern images 21 have a staggered arrangement.

One first island pattern image 21 has a configuration in which two corners of a rectangle at opposite-angle positions are cut; and the one first island pattern image 21 has a contour line 21a extending in a third direction tilted with respect to the X direction and the Y direction. The contour line 21a is the longest of the multiple straight lines that form the contour of the first island pattern images 21.

Figure 2B:
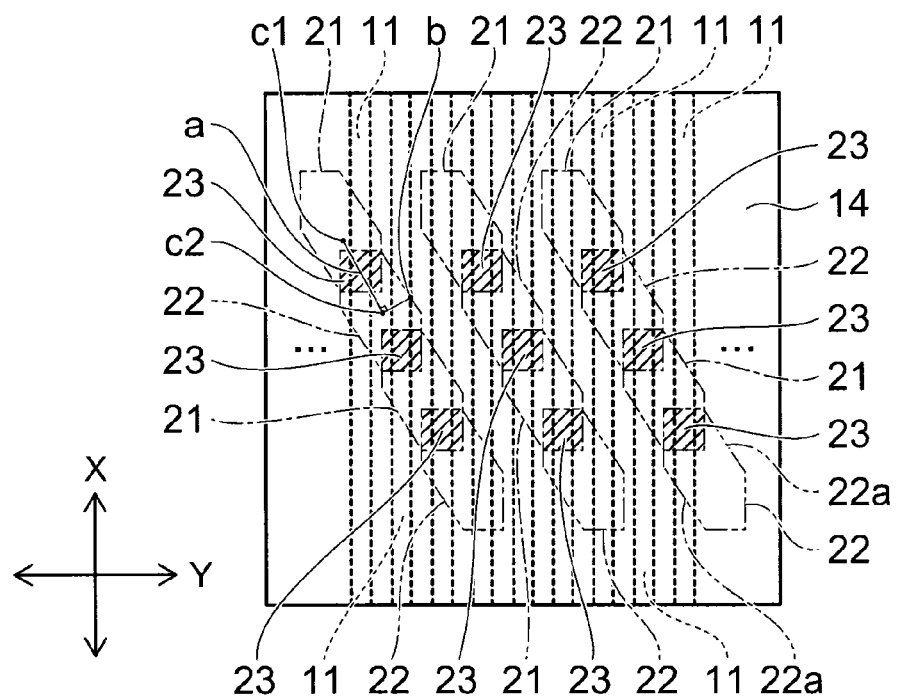

After exposure-transferring the first island pattern images 21, multiple second island pattern images (latent images) 22 are exposure-transferred onto the resist film 14 as shown in FIG. 2B.

The multiple second island pattern images 22 have two columns of the multiple second island pattern images 22 arranged in the Y direction; and the Y-direction positions of the columns are shifted from each other. In other words, the multiple second island pattern images 22 have a staggered arrangement.

The second island pattern images 22 and the first island pattern images 21 are congruent figures. Accordingly, the second island pattern image 22 also has a configuration in which two corners of a rectangle at opposite-angle positions are cut; and the second island pattern image 22 has a contour line 22a extending in a fourth direction tilted with respect to the X direction and the Y direction. The contour line 22a is the longest of the multiple straight lines that form the contour of the second island pattern image 22.

The third direction in which the contour line 21a of the first island pattern image 21 extends is substantially parallel to the fourth direction in which the contour line 22a of the second island pattern image 22 extends.

The second island pattern image 22 is exposure-transferred onto the resist film 14 with a portion of the second island pattern image 22 overlapping the first island pattern image 21. A third-direction end portion of the first island pattern image 21 and a fourth-direction end portion of the second island pattern image 22 overlap. Thus, the first island pattern image 21 and the second island pattern image 22 communicate in the third direction or the fourth direction.

In FIG. 2B, regions 23 where the first island pattern images 21 and the second island pattern images 22 overlap are illustrated by the diagonal lines.

For three active regions 11 including the active region 11 positioned under the region 23 and two of the active regions 11 provided on either side of the active region 11 in the Y direction, the first island pattern image 21 and the second island pattern image 22 belonging to one column overlap on the active region 11 on one Y-direction side (in FIG. 2B, the left side); and the first island pattern image 21 and the second island pattern image 22 belonging to another column overlap on the active region 11 on the other Y-direction side (in FIG. 2B, the right side). In other words, the first island pattern images 21 and the second island pattern images 22 belonging to each of the columns overlap on the three active regions 11 as an island pattern image group that is continuous in the X direction.

Conversely, one active region 11 is positioned between the first island pattern images 21 adjacent to each other in the Y direction; and one active region 11 is positioned between the second island pattern images 22 adjacent to each other in the Y direction. Accordingly, when viewed in plan as shown in FIG. 2B, the island pattern image group that overlaps on the three active regions 11 described above is not continuous in the Y direction with another island pattern image group that overlaps on three active regions 11 adjacent to the three active regions 11 described above.

A point b on the contour of the second island pattern images 22 where the distance from the point b to a straight line a connecting a center position c1 of the first island pattern image 21 to a center position c2 of the second island pattern image 22 having a portion overlapping the first island pattern image 21 in a direction perpendicular to the straight line a is a maximum is positioned on the contour line 22a extending in the fourth direction tilted with respect to the X direction and the Y direction. In other words, the point b is separated from another first island pattern image 21 adjacent to the first island pattern image 21 in the Y direction.

The resist film 14 is a negative resist film.

The regions where the first island pattern images 21 are exposure-transferred and the regions where the second island pattern images 22 are exposure-transferred are unexposed regions. Accordingly, after the first island pattern images 21 and the second island pattern images 22 are exposure-transferred, the unexposed regions of the region of the resist film 14 shown in FIG. 2B are only the regions 23 where the first island pattern images 21 and the second island pattern images 22 overlap.

Each of the regions 23 is positioned on a different active region 11. The pitch of the regions 23 in the Y direction is larger than the pitch of the active regions 11 in the Y direction. When viewed in plan as shown in FIG. 2B, two active regions 11 are positioned between two regions 23 adjacent to each other in the Y direction.

After exposure-transferring the first island pattern images 21 and the second island pattern images 22, for example, the substrate 10 is placed on a hotplate; and PEB (post exposure bake) is performed at 100° C.

Figure 3:
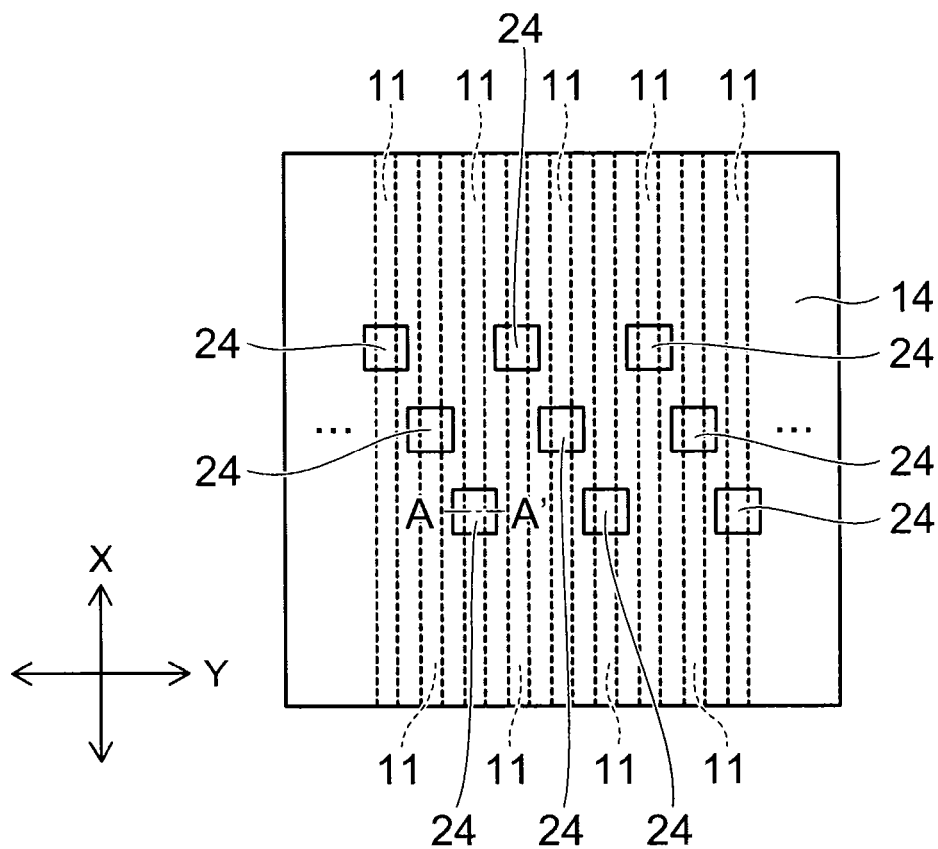

After the PEB, the resist film 14 is developed using, for example, a non-polar organic solvent. The regions 23 which are the unexposed regions where the first island pattern images 21 and the second island pattern images 22 overlap are selectively removed by developing; and multiple holes 24 are made in the resist film 14 as shown in FIG. 3.

The multiple holes 24 have three columns of the multiple holes 24 arranged in the Y direction; and the Y-direction positions of the columns are shifted from each other. In other words, the multiple holes 24 have a staggered arrangement. Each of the holes 24 is positioned on a different active region 11. One hole 24 is not positioned to straddle two active regions 11. The pitch of the holes 24 in the Y direction is larger than the pitch of the active regions 11 in the Y direction. Two active regions 11 are positioned under the region between the holes 24 adjacent to each other in the Y direction.

After making the holes 24 in the resist film 14, the lower layers are etched using the resist film 14 as a mask.

Figure 18B:
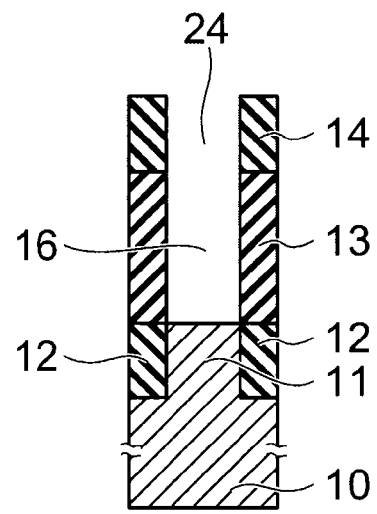

As shown in FIG. 18B, the inter-layer film 13 under the holes 24 of the resist film 14 is etched to make holes 16 in the inter-layer film 13 to reach the active regions 11. FIG. 18B corresponds to a line A-A' enlarged cross section of FIG. 3.

Figure 18C:
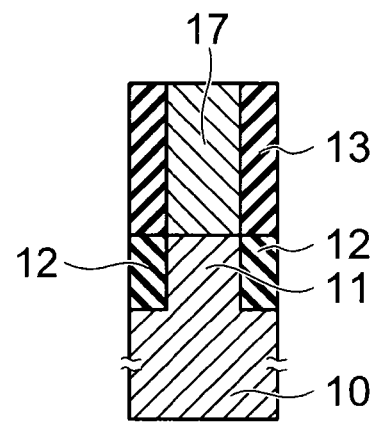

As shown in FIG. 18C, a metal 17 is filled into the holes 16 made in the inter-layer film 13. The not-shown bit lines are formed on the inter-layer film 13 and on the metal 17. The multiple bit lines corresponding to the number of the active regions 11 are formed; and each of the active regions 11 is electrically connectable to the corresponding bit line via the metal 17.

According to the first embodiment described above, the holes 24 having a micro size not more than the resolution limit of the exposure apparatus can be made by a double exposure method by transferring the patterns (the regions 23 where the first island pattern images 21 and the second island pattern images 22 overlap) for making the holes 24 in the resist film 14.

In the bit line contact region between the select gates SG shown in FIG. 19A described above, the pitch of the bit line contacts CB in the Y direction is twice the pitch of the active regions 11 in the Y direction; and two bit line contacts CB are arranged in a direction tilted with respect to the X direction and the Y direction.

Figure 19B:
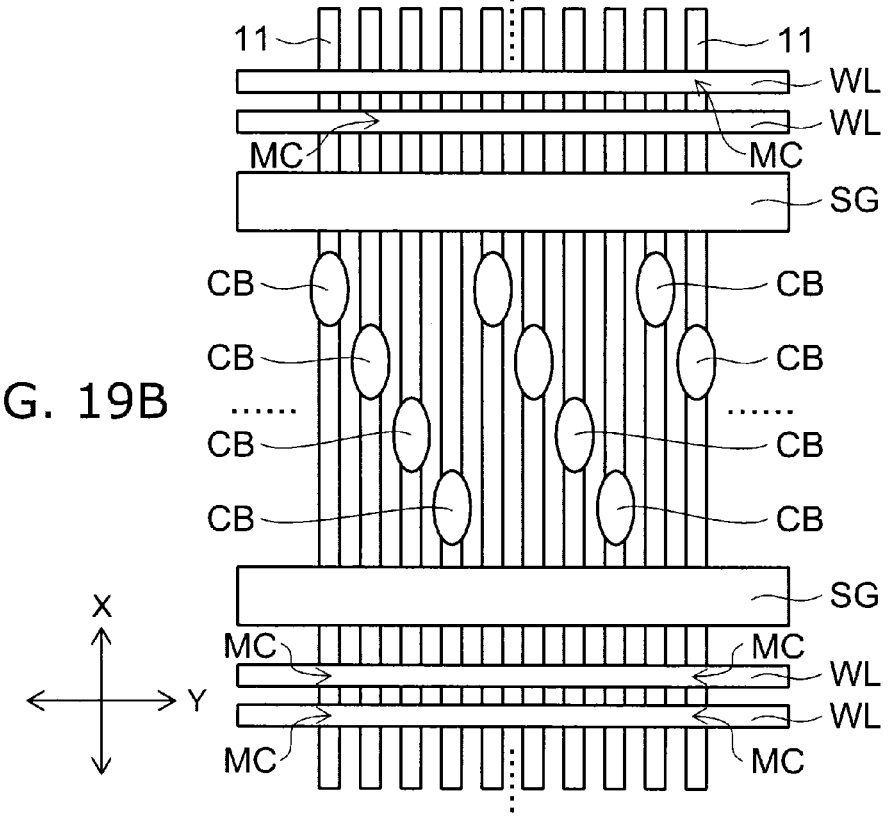

Also, in the bit line contact region between the select gates SG shown in FIG. 19B, the pitch of the bit line contacts CB in the Y direction is four times the pitch of the active regions 11 in the Y direction; and four bit line contacts CB are arranged in the direction tilted with respect to the X direction and the Y direction.

Although the pitch of the bit line contacts CB in the Y direction can be increased as the number of the bit line contacts CB arranged in the direction tilted with respect to the X direction and the Y direction increases, the X-direction size of the bit line contact region increases.

Although the X-direction size of the bit line contact region can be reduced if the number of the bit line contacts CB arranged in the direction tilted with respect to the X direction and the Y direction is reduced, the pitch of the bit line contacts CB in the Y direction decreases.

Figure 20A:
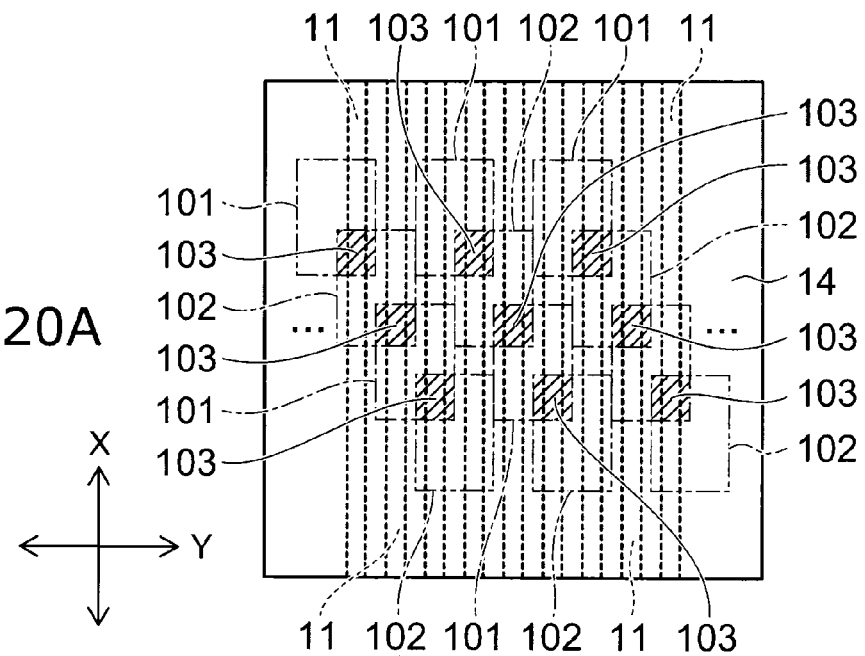
FIGS. 20A and 20B are schematic plan views showing a patterning method of a comparative example.

As shown in the comparative example of FIG. 20A, in the case where the pitch of the bit line contacts CB in the Y direction decreases, the Y-direction distance between first island pattern images 101 and second island pattern images 102 for forming the bit line contacts CB decreases; and the possibility of the first island pattern images 101 and the second island pattern images 102 undesirably overlapping in undesired regions other than regions 103 illustrated by the diagonal lines in FIG. 20A increases.

In the comparative example of FIG. 20A, both the first island pattern image 101 and the second island pattern image 102 are formed in rectangular configurations having long sides extending in the X direction and short sides extending in the Y direction.

In the case where the resist film 14 undesirably has openings at regions other than the desired contact regions, this may cause leak defects.

Conversely, according to the first embodiment as shown in FIGS. 2A and B, by correcting the contour configurations of the first island pattern images 21 and the second island pattern images 22, overlapping outside the contact regions between the first island pattern images 21, between the second island pattern images 22, and between the first island pattern image 21 and the second island pattern image 22 can be prevented.

Specifically, the first island pattern image 21 and the second island pattern image 22 have configurations that respectively have the contour lines 21a and 22a extending in the direction tilted with respect to the X direction in which the active regions 11 which are the object of the alignment of the holes 24 extend and the Y direction in which the multiple active regions 11 are arranged; and jutting of the contour lines 21a and 22a in the Y direction is suppressed.

For the first island pattern images 21 and the second island pattern images 22, groups that are continuous in the X direction while having overlapping portions in the direction tilted with respect to the X direction and the Y direction are multiply formed; and the spacing between the multiple groups in the Y direction is sufficiently ensured.

According to the first embodiment, the Y direction pitch of the holes 24 can be reduced while preventing undesired overlapping of the latent pattern images of the double exposure method. By reducing the arrangement number of the holes 24 in the direction tilted with respect to the X direction and the Y direction by reducing the Y direction pitch of the holes 24, not only can the X-direction size of the bit line contact region be reduced; but also the chip size can be reduced.

Either the first island pattern image 21 or the second island pattern image 22 may be exposure-transferred onto the resist film 14 first.

Second Embodiment

Figure 4A:
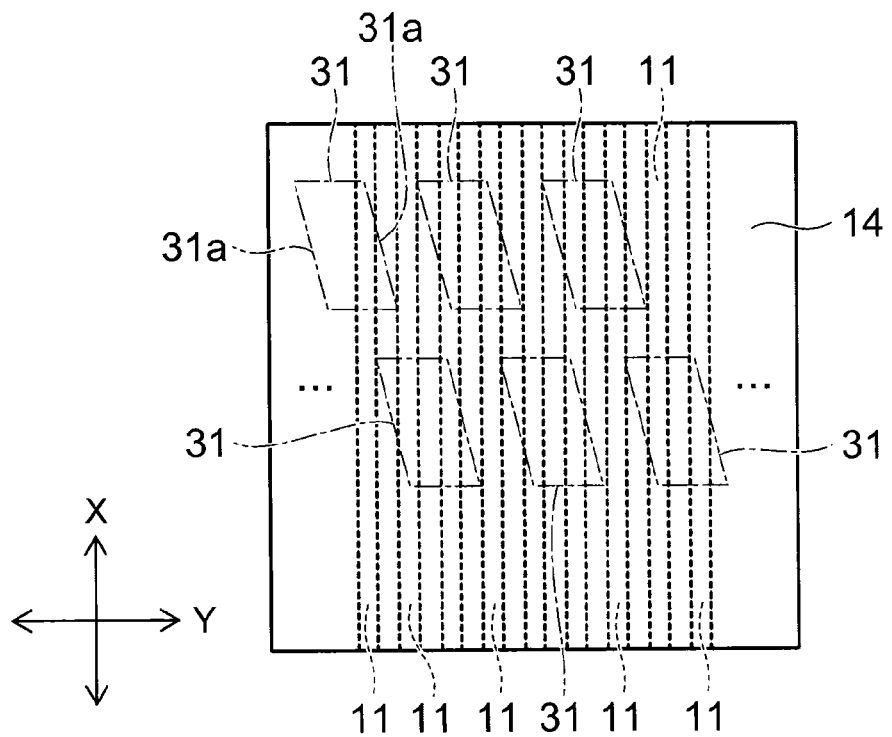
FIGS. 4A to 5 are schematic plan views showing a patterning method of a second embodiment.
Figure 4B:
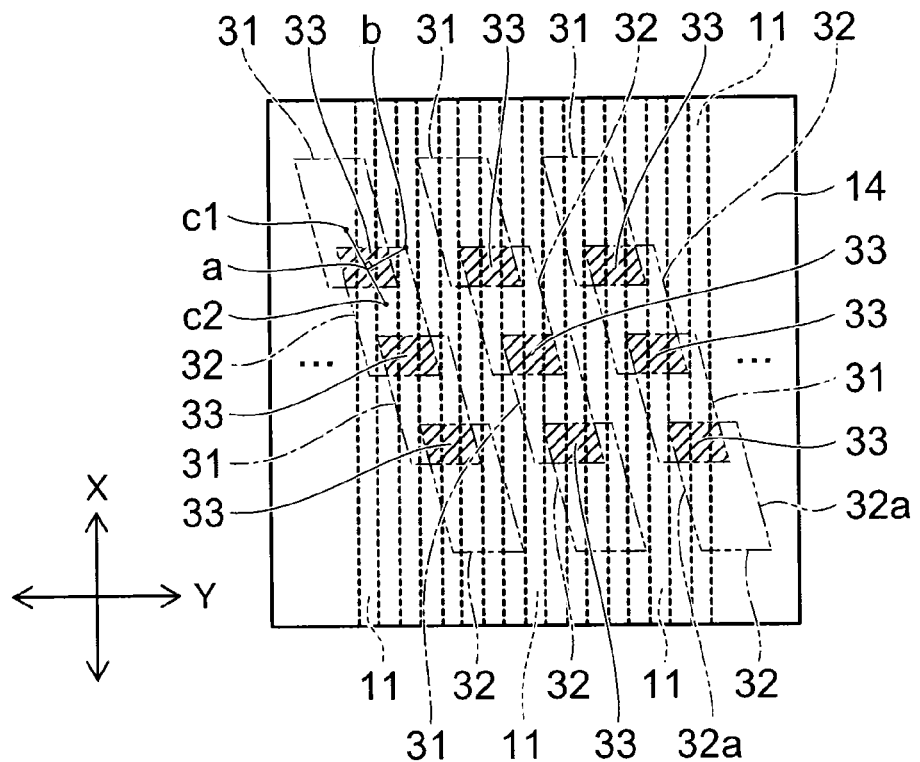
Figure 5:
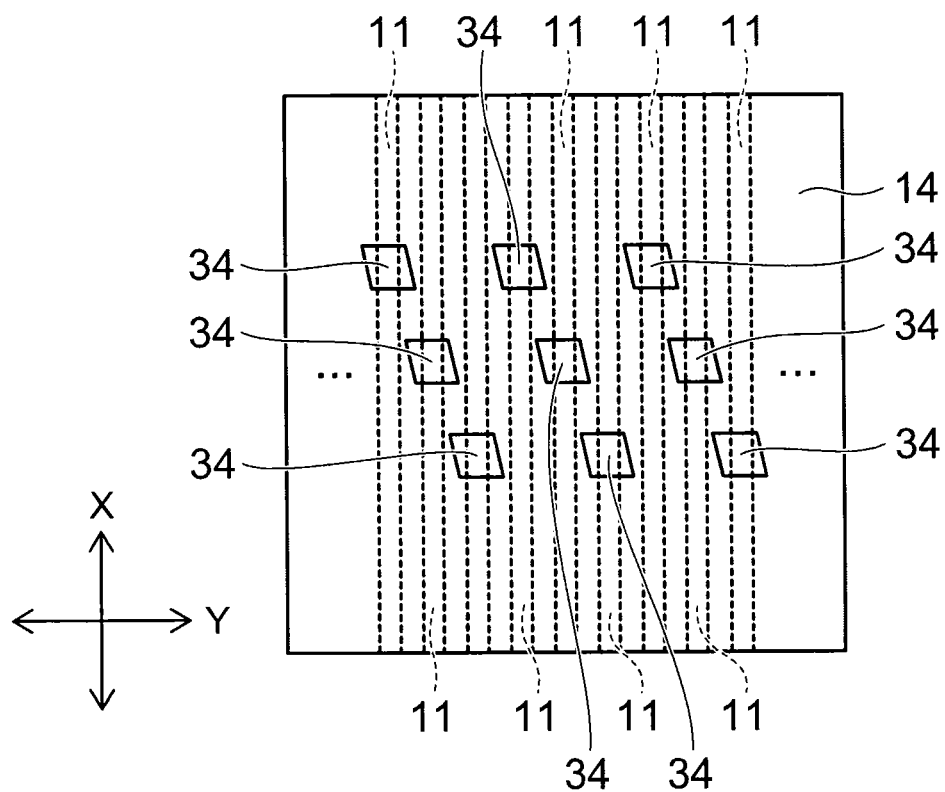

FIG. 4A to FIG. 5 are schematic plan views showing a patterning method of a second embodiment.

Similarly to the first embodiment, FIG. 4A to FIG. 5 show the region between the select gates SG of FIGS. 19A and B.

Similarly to the first embodiment, the multiple active regions 11 are formed as the multiple line patterns on the substrate 10; the inter-layer film 13 is formed on the active regions 11; and the resist film 14 is formed on the inter-layer film 13.

As shown in FIG. 4A, multiple first island pattern images (latent images) 31 are exposure-transferred onto the resist film 14 by lithography using a not-shown mask (reticle).

The multiple first island pattern images 31 have two columns of the multiple first island pattern images 31 arranged in the Y direction; and the Y-direction positions of the columns are shifted from each other. In other words, the multiple first island pattern images 31 have a staggered arrangement.

One first island pattern image 31 is formed in a parallelogram and has a pair of parallel long-side contour lines 31a extending in the third direction tilted with respect to the X direction and the Y direction.

After exposure-transferring the first island pattern images 31, multiple second island pattern images (latent images) 32 are exposure-transferred onto the resist film 14 as shown in FIG. 4B.

The multiple second island pattern images 32 have two columns of the multiple second island pattern images 32 arranged in the Y direction; and the Y-direction positions of the columns are shifted from each other. In other words, the multiple second island pattern images 32 have a staggered arrangement.

The second island pattern images 32 and the first island pattern images 31 are congruent figures. Accordingly, the second island pattern image 32 also is formed in a parallelogram and has a pair of parallel long-side contour lines 32a extending in the fourth direction tilted with respect to the X direction and the Y direction.

The third direction in which the long-side contour lines 31a of the first island pattern image 31 extends is substantially parallel to the fourth direction in which the long-side contour lines 32a of the second island pattern image 32 extends.

The second island pattern image 32 is exposure-transferred onto the resist film 14 with a portion of the second island pattern image 32 overlapping the first island pattern image 31. The third-direction end portion of the first island pattern image 31 and the fourth-direction end portion of the second island pattern image 32 overlap. Thus, the first island pattern image 31 and the second island pattern image 32 communicate in the third direction or the fourth direction.

In FIG. 4B, regions 33 where the first island pattern images 31 and the second island pattern images 32 overlap are illustrated by the diagonal lines.

For three active regions 11 including the active region 11 positioned under the region 33 and two of the active regions 11 provided on either side of the active region 11 in the Y direction, the first island pattern image 31 and the second island pattern image 32 belonging to one column overlap on the active region 11 on one Y-direction side (in FIG. 4B, the left side); and the first island pattern image 31 and the second island pattern image 32 belonging to another column overlap on the active region 11 on the other Y-direction side (in FIG. 4B, the right side). In other words, the first island pattern images 31 and the second island pattern images 32 belonging to each of the columns overlap on the three active regions 11 as an island pattern image group that is continuous in the X direction.

Conversely, one active region 11 is positioned between the first island pattern images 31 adjacent to each other in the Y direction; and one active region 11 is positioned between the second island pattern images 32 adjacent to each other in the Y direction. Accordingly, when viewed in plan as shown in FIG. 4B, the island pattern image group that overlaps on the three active regions 11 described above is not continuous in the Y direction with another island pattern image group that overlaps on three active regions 11 adjacent to the three active regions 11 described above.

Similarly to the first embodiment, the point b on the contour of the second island pattern image 32 where the distance from the point b to the straight line a connecting the center position c1 of the first island pattern image 31 to the center position c2 of the second island pattern image 32 having a portion overlapping the first island pattern image 31 in a direction perpendicular to the straight line a is a maximum is separated from another first island pattern image 31 adjacent to the first island pattern image 31 in the Y direction.

The resist film 14 is a negative resist film.

The regions where the first island pattern images 31 are exposure-transferred and the regions where the second island pattern images 32 are exposure-transferred are unexposed regions. Accordingly, after the first island pattern images 31 and the second island pattern images 32 are exposure-transferred, the unexposed regions of the region of the resist film 14 shown in FIG. 4B are only the regions 33 where the first island pattern images 31 and the second island pattern images 32 overlap.

Each of the regions 33 is positioned on a different active region 11. The pitch of the regions 33 in the Y direction is larger than the pitch of the active regions 11 in the Y direction. When viewed in plan as shown in FIG. 4B, two active regions 11 are positioned between two regions 33 adjacent to each other in the Y direction.

After exposure-transferring the first island pattern images 31 and the second island pattern images 32, for example, the substrate 10 is placed on a hotplate; and PEB (post exposure bake) is performed at 100° C.

After the PEB, the resist film 14 is developed using, for example, a non-polar organic solvent. By the developing, the regions 33 which are the unexposed regions where the first island pattern images 31 and the second island pattern images 32 overlap are selectively removed; and multiple holes 34 are made in the resist film 14 as shown in FIG. 5.

The multiple holes 34 have three columns of the multiple holes 34 arranged in the Y direction; and the Y-direction positions of the columns are shifted from each other. In other words, the multiple holes 34 have a staggered arrangement. Each of the holes 34 is positioned on a different active region 11. One hole 34 is not positioned to straddle two active regions 11. The pitch of the holes 34 in the Y direction is larger than the pitch of the active regions 11 in the Y direction. Two active regions 11 are positioned under the region between the holes 34 adjacent to each other in the Y direction.

After making the holes 34 in the resist film 14, the lower layers are etched using the resist film 14 as a mask.

In other words, similarly to the first embodiment, the inter-layer film 13 under the holes 34 of the resist film 14 is etched to make the holes 16 in the inter-layer film 13 to reach the active regions 11 as shown in FIG. 18B.

As shown in FIG. 18C, the metal 17 is filled into the holes 16 made in the inter-layer film 13. The not-shown bit lines are formed on the inter-layer film 13 and on the metal 17. The multiple bit lines corresponding to the number of the active regions 11 are formed; and each of the active regions 11 is electrically connectable to the corresponding bit line via the metal 17.

According to the second embodiment described above, the holes 34 having a micro size not more than the resolution limit of the exposure apparatus can be made by a double exposure method by transferring the patterns (the regions 33 where the first island pattern images 31 and the second island pattern images 32 overlap) for making the holes 34 in the resist film 14.

In the second embodiment as well, by correcting the contour configurations of the first island pattern image 31 and the second island pattern image 32 as shown in FIGS. 4A and B, overlapping outside the contact regions between the first island pattern images 31, between the second island pattern images 32, and between the first island pattern image 31 and the second island pattern image 32 can be prevented.

Specifically, the first island pattern image 31 and the second island pattern image 32 have parallelogram configurations respectively having the long-side contour lines 31a and 32a extending in the direction tilted with respect to the X direction in which the active regions 11 which are the object of the alignment of the holes 34 extend and the Y direction in which the multiple active regions 11 are arranged; and the jutting of the long-side contour lines 31a and 32a in the Y direction is suppressed.

For the first island pattern images 31 and the second island pattern images 32, groups that are continuous in the X direction while having overlapping portions in the direction tilted with respect to the X direction and the Y direction are multiply formed; and the spacing between the multiple groups in the Y direction is sufficiently ensured.

In the second embodiment as well, the Y direction pitch of the holes 34 can be reduced while preventing the undesired overlapping of the latent pattern images in the double exposure method. By reducing the arrangement number of the holes 34 in the direction tilted with respect to the X direction and the Y direction by reducing the Y direction pitch of the holes 34, not only can the X-direction size of the bit line contact region be reduced; but also the chip size can be reduced.

Either the first island pattern image 31 or the second island pattern image 32 may be exposure-transferred onto the resist film 14 first.

Third Embodiment

Figure 6A:
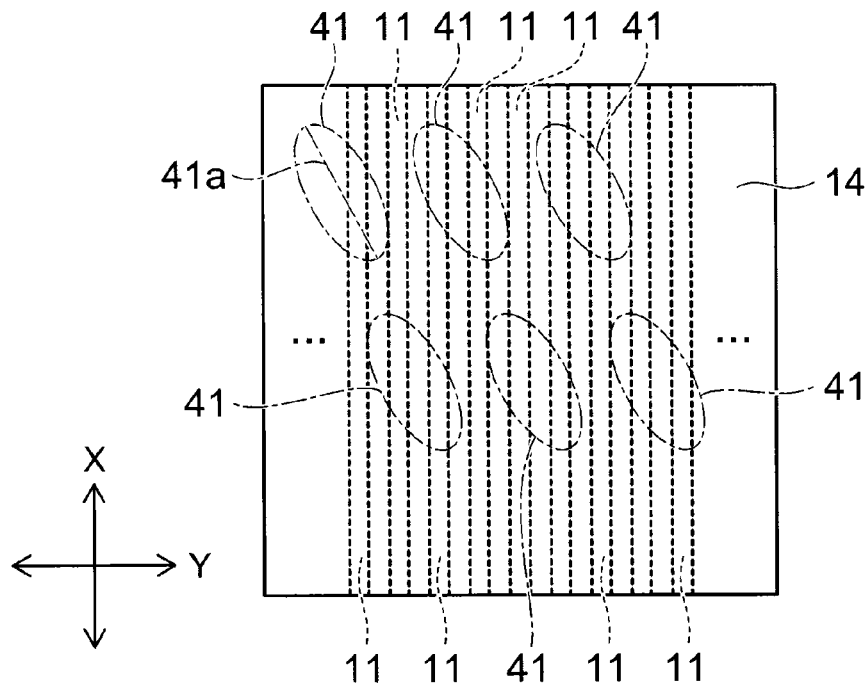
FIGS. 6A to 7 are schematic plan views showing a patterning method of a third embodiment.
Figure 6B:
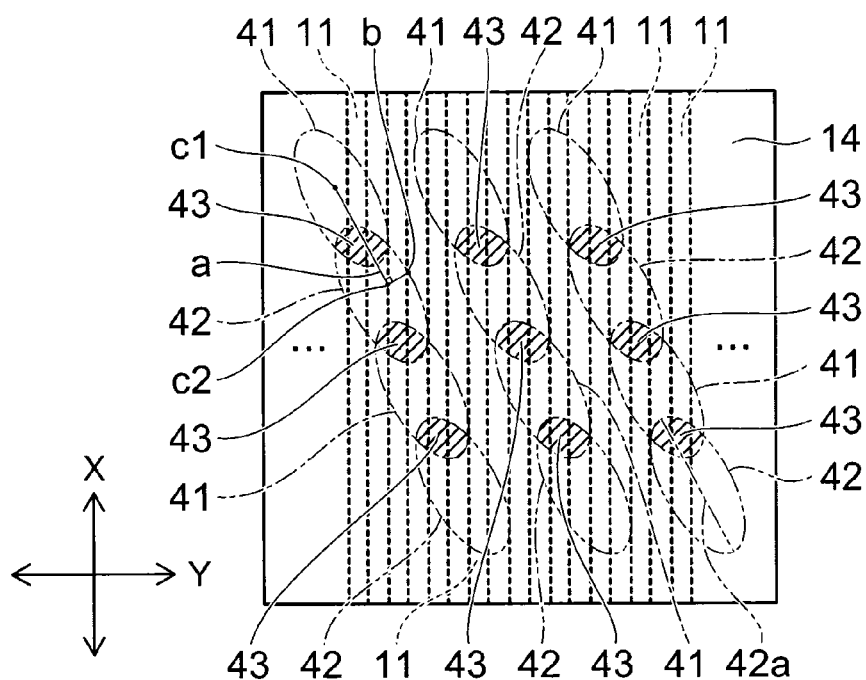
Figure 7:
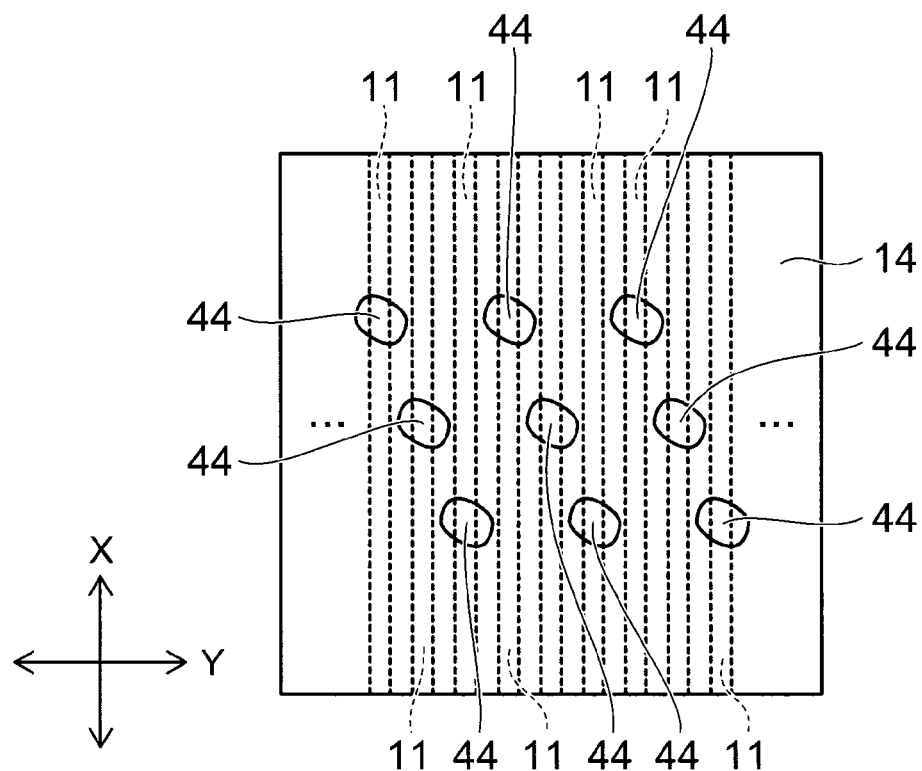

FIG. 6A to FIG. 7 are schematic plan views showing a patterning method of a third embodiment.

Similarly to the first embodiment, FIG. 6A to FIG. 7 show the region between the select gates SG of FIGS. 19A and B.

Similarly to the first embodiment, the multiple active regions 11 are formed as the multiple line patterns on the substrate 10; the inter-layer film 13 is formed on the active regions 11; and the resist film 14 is formed on the inter-layer film 13.

As shown in FIG. 6A, multiple first island pattern images (latent images) 41 are exposure-transferred onto the resist film 14 by lithography using a not-shown mask (reticle).

The multiple first island pattern images 41 have two columns of the multiple first island pattern images 41 arranged in the Y direction; and the Y-direction positions of the columns are shifted from each other. In other words, the multiple first island pattern images 41 have a staggered arrangement.

One first island pattern image 41 is formed in an ellipse and has a major axis 41a extending in the third direction tilted with respect to the X direction and the Y direction.

After exposure-transferring the first island pattern images 41, multiple second island pattern images (the latent images) 42 are exposure-transferred onto the resist film 14 as shown in FIG. 6B.

The multiple second island pattern images 42 have two columns of the multiple second island pattern images 42 arranged in the Y direction; and the Y-direction positions of the columns are shifted from each other. In other words, the multiple second island pattern images 42 have a staggered arrangement.

The second island pattern images 42 and the first island pattern images 41 are congruent figures. Accordingly, the second island pattern image 42 also is formed in an ellipse and has a major axis 42a extending in the fourth direction tilted with respect to the X direction and the Y direction.

The third direction in which the major axis 41a of the first island pattern image 41 extends is substantially parallel to the fourth direction in which the major axis 42a of the second island pattern image 42 extends.

The second island pattern image 42 is exposure-transferred onto the resist film 14 with a portion of the second island pattern image 42 overlapping the first island pattern image 41. The third-direction end portion of the first island pattern image 41 and the fourth-direction end portion of the second island pattern image 42 overlap. Thus, the first island pattern image 41 and the second island pattern image 42 communicate in the third direction or the fourth direction.

In FIG. 6B, regions 43 where the first island pattern images 41 and the second island pattern images 42 overlap are illustrated by the diagonal lines.

For three active regions 11 including the active region 11 positioned under the region 43 and two of the active regions 11 provided on either side of the active region 11 in the Y direction, the first island pattern image 41 and the second island pattern image 42 belonging to one column overlap on the active region 11 on one Y-direction side (in FIG. 6B, the left side); and the first island pattern image 41 and the second island pattern image 42 belonging to another column overlap on the active region 11 on the other Y-direction side (in FIG. 6B, the right side). In other words, the first island pattern images 41 and the second island pattern images 42 belonging to each of the columns overlap on the three active regions 11 as an island pattern image group that is continuous in the X direction.

Conversely, one active region 11 is positioned between the first island pattern images 41 adjacent to each other in the Y direction; and one active region 11 is positioned between the second island pattern images 42 adjacent to each other in the Y direction. Accordingly, when viewed in plan as shown in FIG. 6B, the island pattern image group that overlaps on the three active regions 11 described above is not continuous in the Y direction with another island pattern image group that overlaps on three active regions 11 adjacent to the three active regions 11 described above.

Similarly to the first embodiment, the point b on the contour of the second island pattern images 42 where the distance from the point b to the straight line a connecting the center position c1 of the first island pattern image 41 to the center position c2 of the second island pattern image 42 having a portion overlapping the first island pattern image 41 in a direction perpendicular to the straight line a is a maximum is separated from another first island pattern image 41 adjacent to the first island pattern image 41 in the Y direction.

The resist film 14 is a negative resist film.

The regions where the first island pattern images 41 are exposure-transferred and the regions where the second island pattern images 42 are exposure-transferred are unexposed regions. Accordingly, after the first island pattern images 41 and the second island pattern images 42 are exposure-transferred, the unexposed regions of the region of the resist film 14 shown in FIG. 6B are only the regions 43 where the first island pattern images 41 and the second island pattern images 42 overlap.

Each of the regions 43 is positioned on a different active region 11. The pitch of the regions 43 in the Y direction is larger than the pitch of the active regions 11 in the Y direction. When viewed in plan as shown in FIG. 6B, two active regions 11 are positioned between two regions 43 adjacent to each other in the Y direction.

After exposure-transferring the first island pattern images 41 and the second island pattern images 42, for example, the substrate 10 is placed on a hotplate; and PEB (post exposure bake) is performed at 100° C.

After the PEB, the resist film 14 is developed using, for example, a non-polar organic solvent. By the developing, the regions 43 which are the unexposed regions where the first island pattern images 41 and the second island pattern images 42 overlap are selectively removed; and multiple holes 44 are made in the resist film 14 as shown in FIG. 7.

The multiple holes 44 have three columns of the multiple holes 44 arranged in the Y direction; and the Y-direction positions of the columns are shifted from each other. In other words, the multiple holes 44 have a staggered arrangement. Each of the holes 44 is positioned on a different active region 11. One hole 44 is not positioned to straddle two active regions 11. The pitch of the holes 44 in the Y direction is larger than the pitch of the active regions 11 in the Y direction. Two active regions 11 are positioned under the region between the holes 44 adjacent to each other in the Y direction.

After making the holes 44 in the resist film 14, the lower layers are etched using the resist film 14 as a mask.

In other words, similarly to the first embodiment, the inter-layer film 13 under the holes 44 of the resist film 14 is etched; and the holes 16 are made in the inter-layer film 13 to reach the active regions 11 as shown in FIG. 18B.

As shown in FIG. 18C, the metal 17 is filled into the holes 16 made in the inter-layer film 13. The not-shown bit lines are formed on the inter-layer film 13 and on the metal 17. The multiple bit lines corresponding to the number of the active regions 11 are formed; and each of the active regions 11 is electrically connectable to the corresponding bit line via the metal 17.

According to the third embodiment described above, the holes 44 having a micro size not more than the resolution limit of the exposure apparatus can be made by a double exposure method by transferring the patterns (the regions 43 where the first island pattern images 41 and the second island pattern images 42 overlap) for making the holes 44 in the resist film 14.

In the third embodiment as well, by correcting the contour configurations of the first island pattern image 41 and the second island pattern image 42 as shown in FIGS. 6A and B, overlapping outside the contact regions between the first island pattern images 41, between the second island pattern images 42, and between the first island pattern image 41 and the second island pattern image 42 can be prevented.

Specifically, the first island pattern image 41 and the second island pattern image 42 have elliptical configurations respectively having the major axes 41a and 42a extending in the direction tilted with respect to the X direction in which the active regions 11 which are the object of the alignment of the holes 44 extend and the Y direction in which the multiple active regions 11 are arranged; and the jutting of the contour line in the Y direction is suppressed.

For the first island pattern images 41 and the second island pattern images 42, groups that are continuous in the X direction while having overlapping portions in the direction tilted with respect to the X direction and the Y direction are multiply formed; and the spacing between the multiple groups in the Y direction is sufficiently ensured.

In the third embodiment as well, the Y direction pitch of the holes 44 can be reduced while preventing the undesired overlapping of the latent pattern images in the double exposure method. By reducing the arrangement number of the holes 44 in the direction tilted with respect to the X direction and the Y direction by reducing the Y direction pitch of the holes 44, not only can the X-direction size of the bit line contact region be reduced; but also the chip size can be reduced.

Either the first island pattern image 41 or the second island pattern image 42 may be exposure-transferred onto the resist film 14 first.

Fourth Embodiment

Figure 8A:
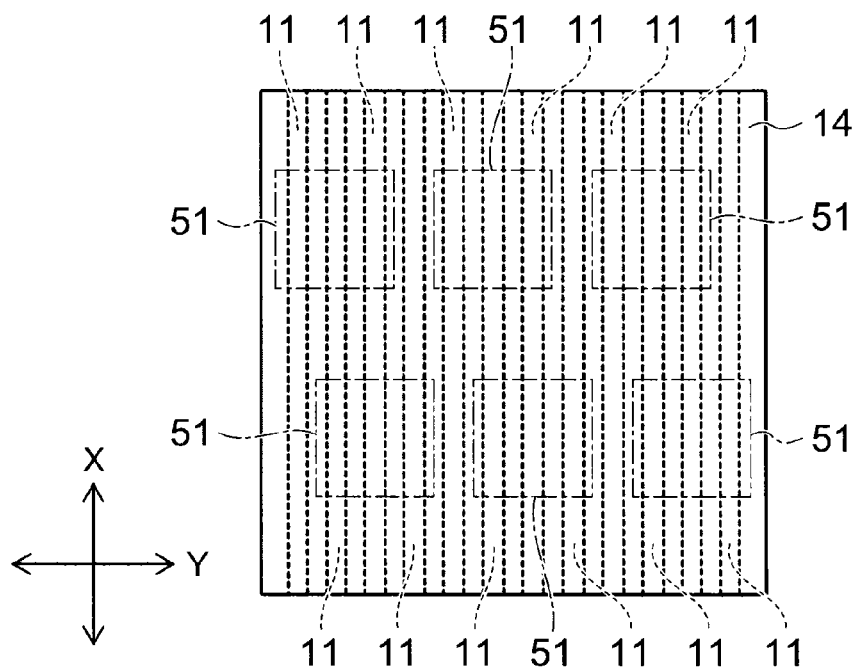
FIGS. 8A to 9 are schematic plan views showing a patterning method of a fourth embodiment.
Figure 8B:
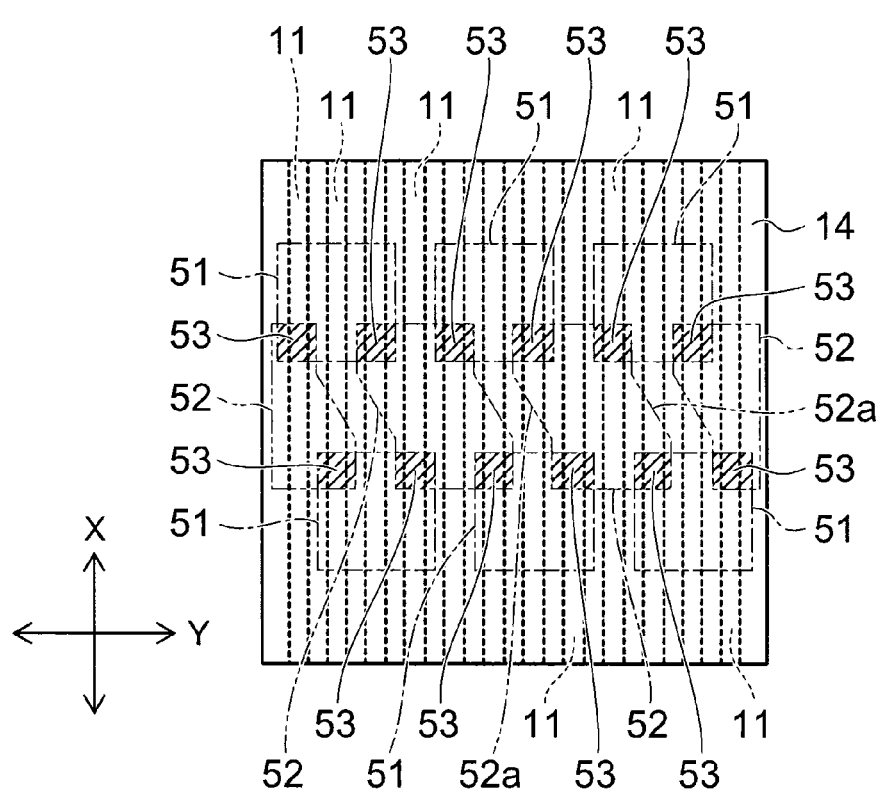
Figure 9:
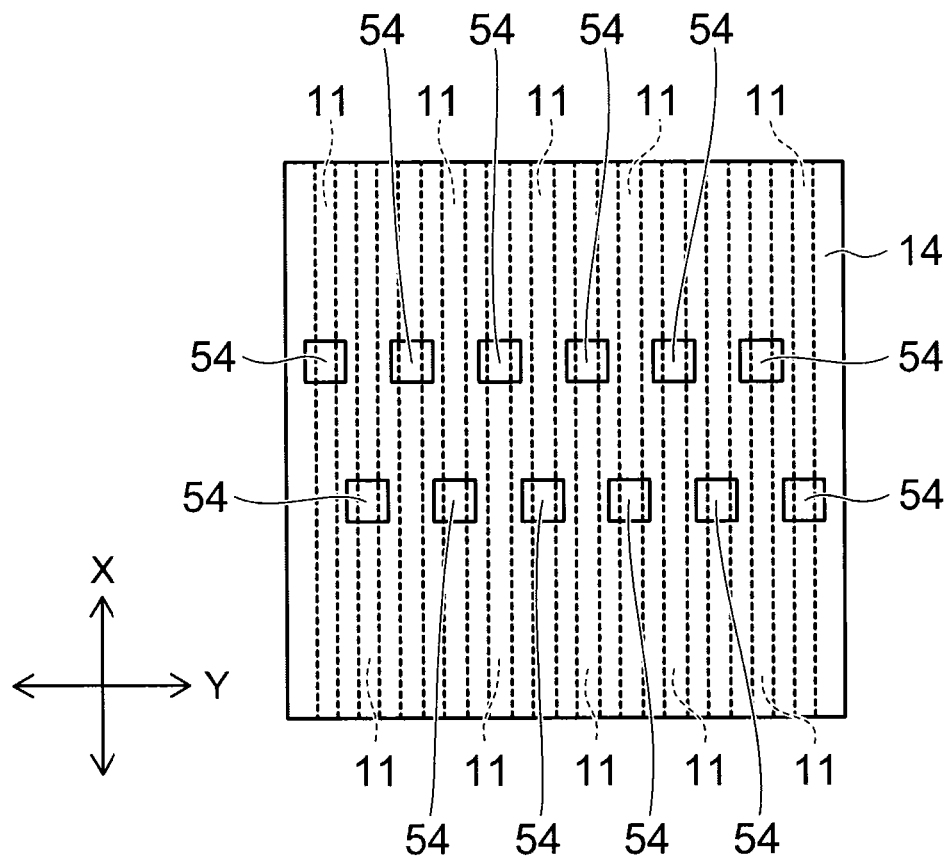

FIG. 8A to FIG. 9 are schematic plan views showing a patterning method of a fourth embodiment.

Similarly to the first embodiment, FIG. 8A to FIG. 9 show the region between the select gates SG of FIGS. 19A and B.

Similarly to the first embodiment, the multiple active regions 11 are formed as the multiple line patterns on the substrate 10; the inter-layer film 13 is formed on the active regions 11; and the resist film 14 is formed on the inter-layer film 13.

As shown in FIG. 8A, multiple first island pattern images (latent images) 51 are exposure-transferred onto the resist film 14 by lithography using a not-shown mask (reticle).

The multiple first island pattern images 51 have two columns of the multiple first island pattern images 51 arranged in the Y direction; and the Y-direction positions of the columns are shifted from each other. In other words, the multiple first island pattern images 51 have a staggered arrangement.

One first island pattern image 51 is formed in a quadrilateral configuration in which a pair of contour lines parallel in the X direction is combined with a pair of contour lines parallel in the Y direction.

After exposure-transferring the first island pattern images 51, multiple second island pattern images (latent images) 52 are exposure-transferred onto the resist film 14 as shown in FIG. 8B.

There is only one column of the multiple second island pattern images 52 arranged in the Y direction.

The second island pattern image 52 has two corner portions formed at one X-direction end portion, two corner portions formed at the other X-direction end portion, and a pair of contour lines 52a parallel to each other and extending in a direction tilted with respect to the X direction and the Y direction.

The second island pattern image 52 is exposure-transferred onto the resist film 14 with each of the four corner portions overlapping a different first island pattern image 51.

In FIG. 8B, regions 53 where the first island pattern images 51 and the second island pattern images 52 overlap are illustrated by the diagonal lines.

Four first island pattern images 51 are disposed around one second island pattern image 52. A corner portion of each of the four first island pattern images 51 around the one second island pattern image 52 overlaps the one second island pattern image 52. In other words, the first island pattern images 51 and the second island pattern images 52 are disposed to be continuous in the X direction and the Y direction.

Specifically, the two corner portions formed at one X-direction end portion of each of the second island pattern images 52 respectively overlap corner portions of two first island pattern images 51 adjacent to each other in the Y direction. The two corner portions formed at the other X-direction end portion of each of the second island pattern images 52 respectively overlap corner portions of two first island pattern images 51 adjacent to each other in the Y direction in a column different from that of the two first island pattern images 51 recited above.

When viewed in plan as shown in FIG. 8B, one first island pattern image 51 overlaps three active regions 11 arranged in the Y direction; and one active region 11 is positioned between the first island pattern images 51 adjacent to each other in the Y direction.

The first island pattern images 51 do not overlap each other in the Y direction; and the second island pattern images 52 do not overlap each other in the Y direction.

The resist film 14 is a negative resist film.

The regions where the first island pattern images 51 are exposure-transferred and the regions where the second island pattern images 52 are exposure-transferred are unexposed regions. Accordingly, after the first island pattern images 51 and the second island pattern images 52 are exposure-transferred, the unexposed regions of the region of the resist film 14 shown in FIG. 8B are only the regions 53 where the first island pattern images 51 and the second island pattern images 52 overlap.

Each of the regions 53 is positioned on a different active region 11. The pitch of the regions 53 in the Y direction is larger than the pitch of the active regions 11 in the Y direction. When viewed in plan as shown in FIG. 8B, one active region 11 is positioned between two regions 53 adjacent to each other in the Y direction.

After exposure-transferring the first island pattern images 51 and the second island pattern images 52, for example, the substrate 10 is placed on a hotplate; and PEB (post exposure bake) is performed at 100° C.

After the PEB, the resist film 14 is developed using, for example, a non-polar organic solvent. By the developing, the regions 53 which are the unexposed regions where the first island pattern images 51 and the second island pattern images 52 overlap are selectively removed; and multiple holes 54 are made in the resist film 14 as shown in FIG. 9.

The multiple holes 54 have two columns of the multiple holes 54 arranged in the Y direction; and the Y-direction positions of the columns are shifted from each other. In other words, the multiple holes 54 have a staggered arrangement. Each of the holes 54 is positioned on a different active region 11. One hole 54 is not positioned to straddle two active regions 11. The pitch of the holes 54 in the Y direction is larger than the pitch of the active regions 11 in the Y direction. One active region 11 is positioned under the region between the holes 54 adjacent to each other in the Y direction.

After making the holes 54 in the resist film 14, the lower layers are etched using the resist film 14 as a mask.

In other words, similarly to the first embodiment, the inter-layer film 13 under the holes 54 of the resist film 14 is etched to make the holes 16 in the inter-layer film 13 to reach the active regions 11 as shown in FIG. 18B.

As shown in FIG. 18C, the metal 17 is filled into the holes 16 made in the inter-layer film 13. The not-shown bit lines are formed on the inter-layer film 13 and on the metal 17. The multiple bit lines are formed corresponding to the number of the active regions 11; and each of the active regions 11 is electrically connectable to the corresponding bit line via the metal 17.

According to the fourth embodiment described above, the holes 54 having a micro size not more than the resolution limit of the exposure apparatus can be made by a double exposure method by transferring the patterns (the regions 53 where the first island pattern images 51 and the second island pattern images 52 overlap) for making the holes 54 in the resist film 14.

The fourth embodiment is advantageous for reducing the X-direction size of the bit line contact region because the number of the holes 54 arranged in the direction tilted with respect to the X direction and the Y direction is two.

Figure 20B:
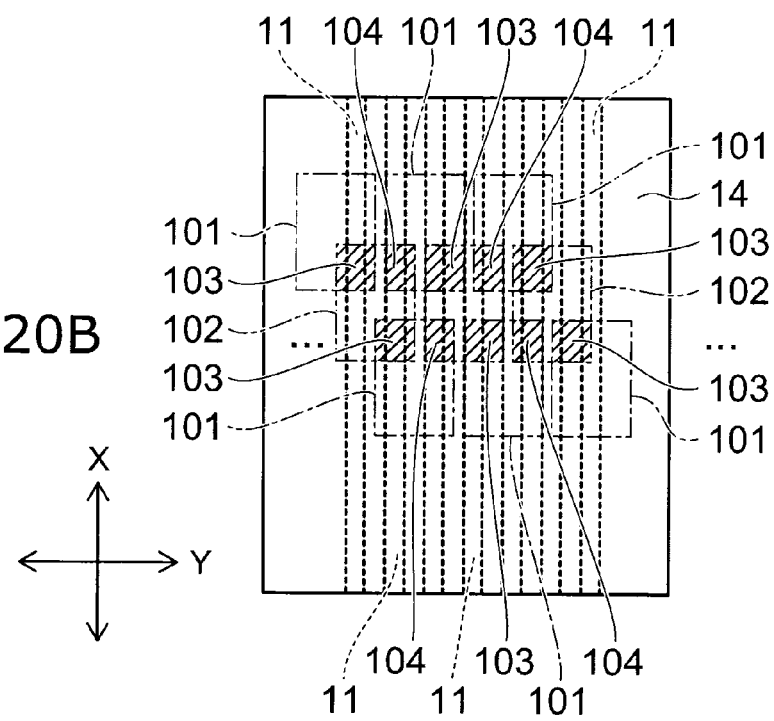

Here, FIG. 20B shows a double exposure method according to a comparative example for forming a pattern in which two holes are arranged in the direction tilted with respect to the X direction and the Y direction.

In the case where the number of holes arranged in the direction tilted with respect to the X direction and the Y direction decreases, the pitch of the holes in the Y direction decreases.

In the case where two holes are arranged in the direction tilted with respect to the X direction and the Y direction, the spacing in the Y direction between the first island pattern images 101, the spacing in the Y direction between the second island pattern images 102, and the spacing in the Y direction between the first island pattern image 101 and the second island pattern image 102 become narrower than the case of FIG. 20A where three holes are arranged in the direction tilted with respect to the X direction and the Y direction; and the possibility of the first island pattern images 101 and the second island pattern images 102 undesirably overlapping in undesired regions 104 other than the regions 103 in FIG. 20B increases. There is also a possibility that the region 103 and the region 104 may communicate in the Y direction; and holes that communicate in the Y direction may be undesirably made.

It is difficult to cause the first island pattern images 101 and the second island pattern images 102 not to overlap in the Y direction in the case where two holes are arranged in the direction tilted with respect to the X direction and the Y direction for the active regions 11 formed by, for example, a sidewall transfer method, etc., and having a line width and a pitch that are not more than the resolution limit of the exposure apparatus.

Therefore, according to the fourth embodiment, the regions 53 where the first island pattern images 51 and the second island pattern images 52 overlap can be prevented from undesirably communicating in the Y direction even while the first island pattern images 51 and the second island pattern images 52 communicate in the Y direction by correcting the contour configurations, the widths in the Y direction, and the dispositions of the first island pattern image 51 and the second island pattern image 52 as shown in FIG. 8B.

Accordingly, according to the fourth embodiment, the Y direction pitch of the holes 54 can be reduced while preventing the undesired overlapping of the latent pattern images in the double exposure method. By reducing the arrangement number of the holes 54 in the direction tilted with respect to the X direction and the Y direction by reducing the Y direction pitch of the holes 54, not only can the X-direction size of the bit line contact region be reduced; but also the chip size can be reduced.

Either the first island pattern image 51 or the second island pattern image 52 may be exposure-transferred onto the resist film 14 first.

Fifth Embodiment

FIGS. 10 to 14 are schematic plan views showing a patterning method of a fifth embodiment.

Figure 10:
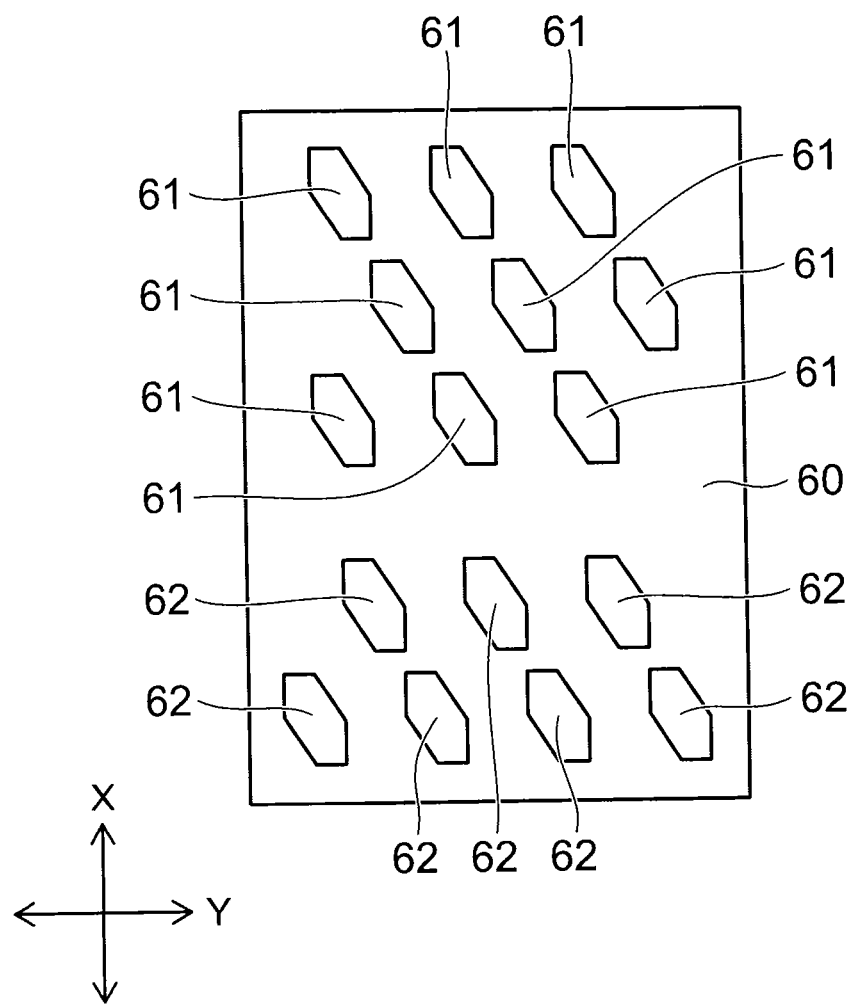
FIGS. 10 to 14 are schematic plan views showing a patterning method of a fifth embodiment.

In the fifth embodiment, the first pattern images 21 and the second pattern images 22 of the first embodiment described above are exposure-transferred onto the resist film 14 using a mask (a reticle) 60 shown in FIG. 10.

As shown in FIG. 10, multiple first island patterns 61 and multiple second island patterns 62 are formed in the mask 60.

The first island patterns 61 are patterns for exposure-transferring the first island pattern images 21; and the second island patterns 62 are patterns for exposure-transferring the second island pattern images 22. In other words, the patterns 61 for exposure-transferring the first island pattern images 21 and the patterns 62 for exposure-transferring the second island pattern images 22 are formed in the same mask 60.

The multiple first island patterns 61 have three columns of the multiple first island patterns 61 arranged in the Y direction; and the Y-direction positions of the columns are shifted from each other. In other words, the multiple first island patterns 61 have a staggered arrangement.

The multiple second island patterns 62 have two columns of the multiple second island patterns 62 arranged in the Y direction; and the Y-direction positions of the columns are shifted from each other. In other words, the multiple second island patterns 62 have a staggered arrangement.

Although the configuration schematically shown in FIG. 10 is a configuration in which the configuration of the first island pattern 61 and the configuration of the second island pattern 62 are matched respectively to the configurations of the first island pattern image 21 and the second island pattern image 22 which are the transfer images, strictly speaking, the pattern configuration on the mask 60 is corrected by OPC (optical proximity correction), etc.

Figure 11:
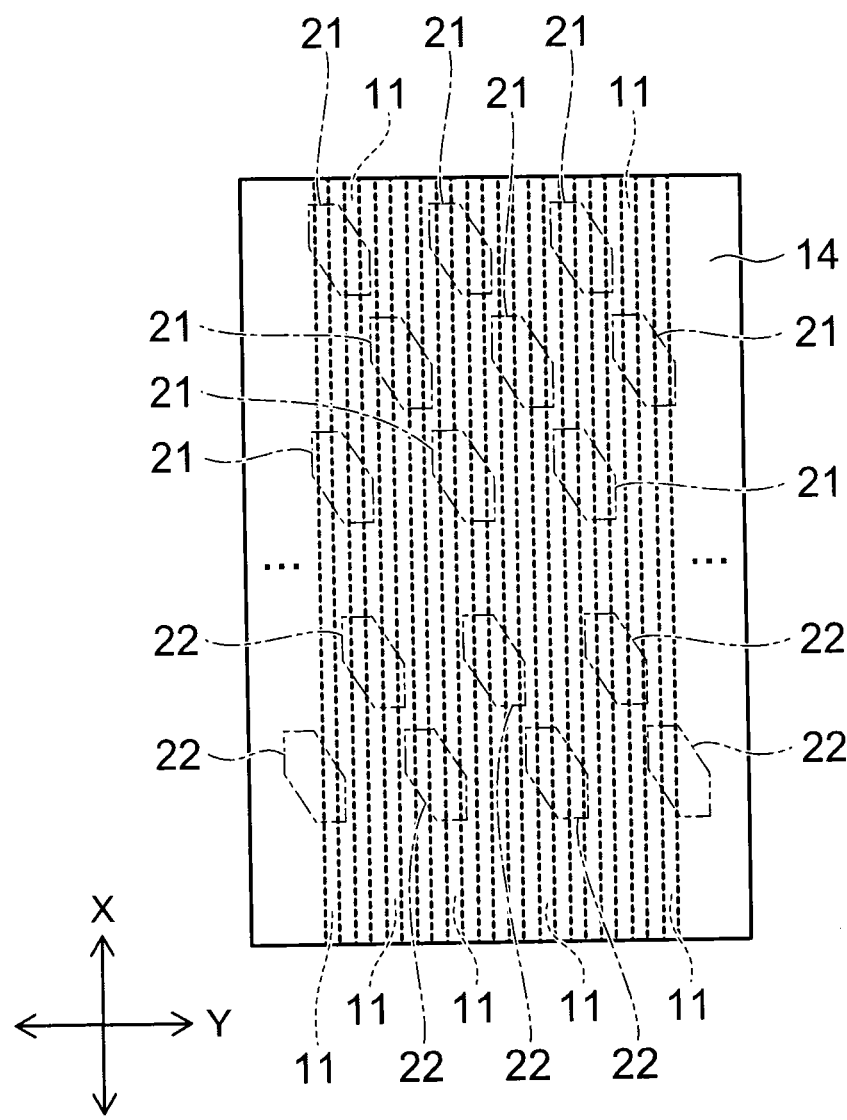

FIG. 11 shows the first exposure process onto the resist film 14.

The first island patterns 61 formed in the mask 60 are exposure-transferred onto the resist film 14 as the first island pattern images 21; and the second island patterns 62 formed in the same mask 60 are exposure-transferred onto the resist film 14 as the second island pattern images 22.

The multiple first island pattern images 21 have three columns of the multiple first island pattern images 21 arranged in the Y direction; and the Y-direction positions of the columns are shifted from each other. In other words, the multiple first island pattern images 21 have a staggered arrangement.

The multiple second island pattern images 22 have two columns of the multiple second island pattern images 22 arranged in the Y direction; and the Y-direction positions of the columns are shifted from each other. In other words, the multiple second island pattern images 22 have a staggered arrangement.

In the first exposure, the first island pattern images 21 and the second island pattern images 22 do not overlap.

Figure 12:
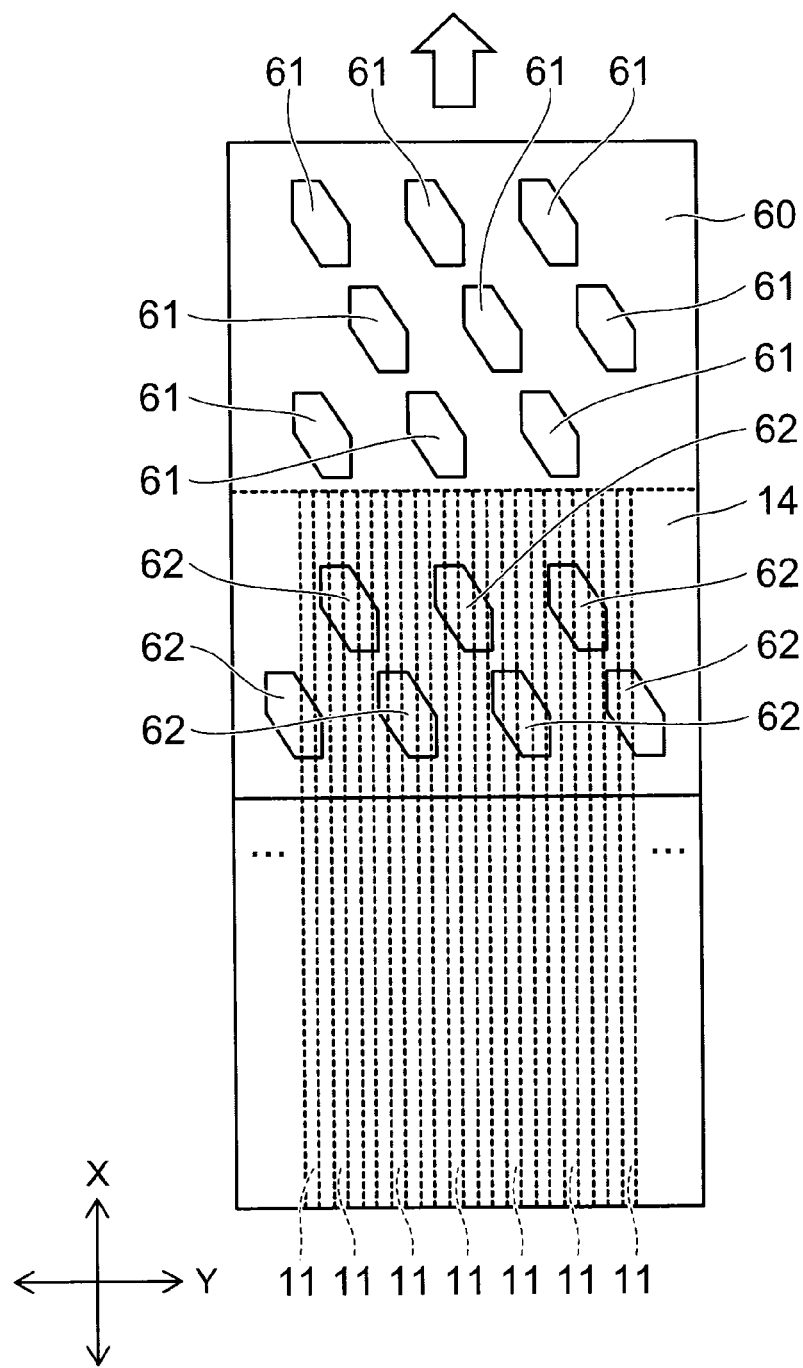

Then, as shown in FIG. 12, the second island patterns 62 formed in the mask 60 are exposure-transferred as the second island pattern images 22 onto the resist film 14 by overlapping a portion of the first island pattern images 21 exposure-transferred in the first exposure by sliding the mask 60 relatively to the resist film 14 in the X direction (in FIG. 12, the upward direction) from the first exposure position.

Figure 13:
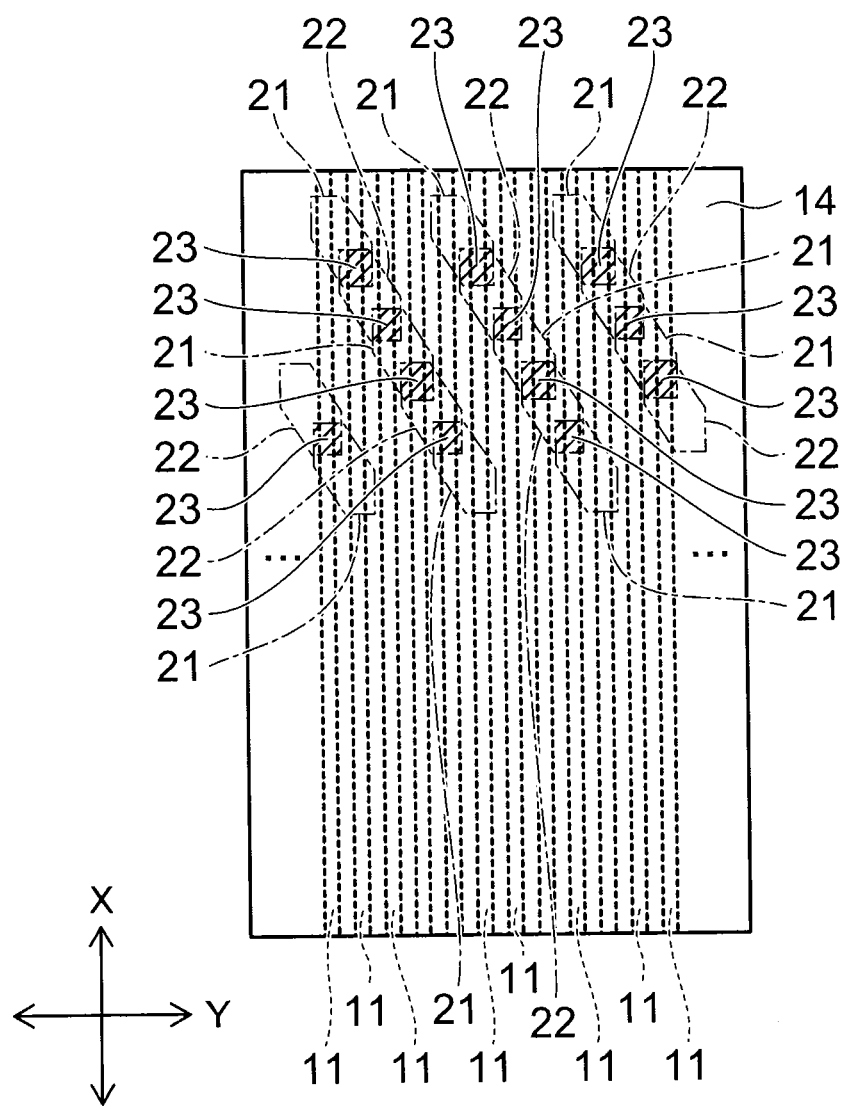
Figure 14:
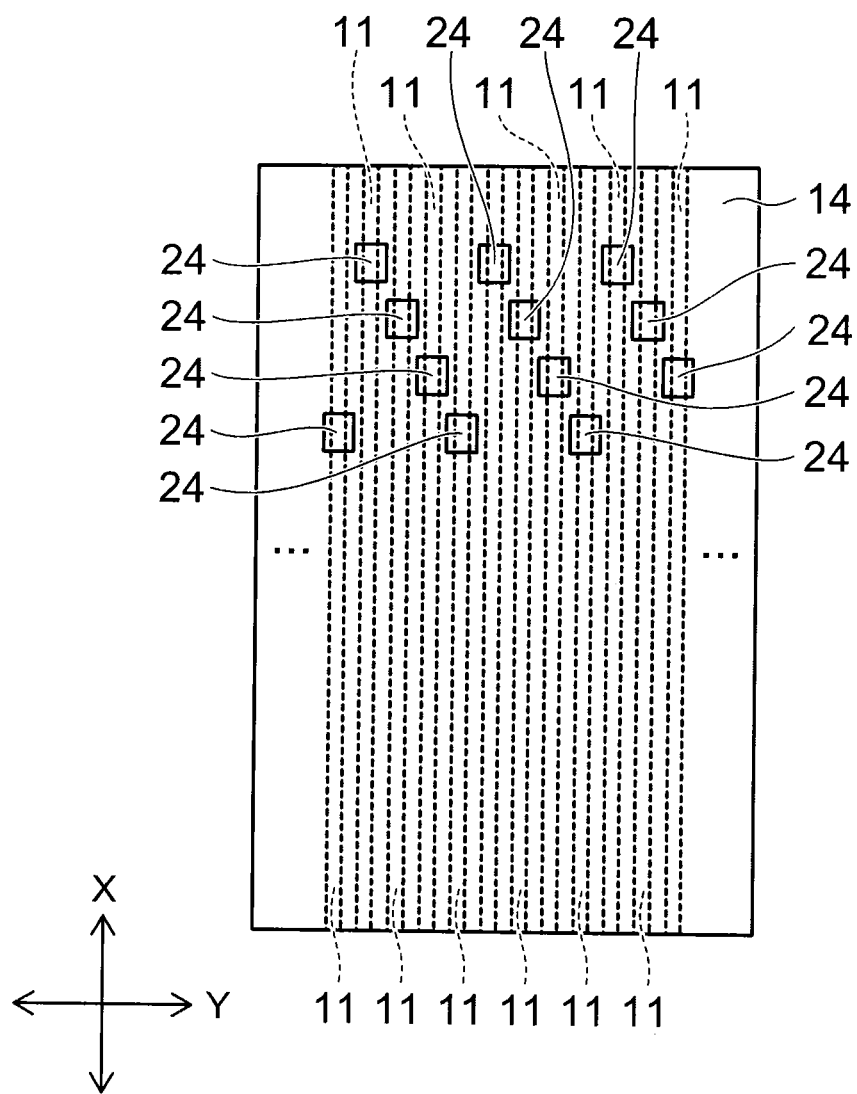

In FIG. 13, the regions 23 where the first island pattern images 21 and the second island pattern images 22 overlap are illustrated by the diagonal lines.

Similarly to the first embodiment, the first island pattern images 21 do not overlap each other in the Y direction. The second island pattern images 22 do not overlap each other in the Y direction. The first island pattern images 21 and the second island pattern images 22 are continuous in the X direction while having overlapping portions in the direction tilted with respect to the X direction and the Y direction.

The regions where the first island pattern images 21 are exposure-transferred and the regions where the second island pattern images 22 are exposure-transferred are unexposed regions. The entire surface of the region including the unexposed regions due to the second island pattern images 22 transferred in the first exposure shown in FIG. 11 is exposed in the second exposure shown in FIG. 12. For the unexposed regions due to the first island pattern images 21 transferred in the first exposure shown in FIG. 11, the regions other than the regions 23 overlapped by the second island pattern images 22 in the second exposure shown in FIG. 13 are exposed.

Accordingly, after the two exposures end, the unexposed regions of the region of the resist film 14 shown in FIG. 13 are only the regions 23 where the first island pattern images 21 and the second island pattern images 22 overlap.

Each of the regions 23 is positioned on a different active region 11. The pitch of the regions 23 in the Y direction is larger than the pitch of the active regions 11 in the Y direction.

Hereinafter, the processes progress similarly to those of the first embodiment; and after the PEB (post exposure bake), the resist film 14 is developed using, for example, a non-polar organic solvent.

By the developing, the regions 23 which are the unexposed regions where the first island pattern images 21 and the second island pattern images 22 overlap are selectively removed; and the multiple holes 24 are made in the resist film 14 as shown in FIG. 3.

According to the fifth embodiment, one common mask 60 is used when performing the two exposure-transfers for forming the regions 23 where the first island pattern images 21 and the second island pattern images 22 overlap.

Because the alignment of the second exposure is performed by sliding the mask 60 relatively to the resist film 14 in only one direction (the X direction) after the first exposure, the positional precision of the overlapping of the first island pattern images 21 and the second island pattern images 22 can be increased.

Accordingly, according to the fifth embodiment, it is possible to reduce the cost of making the mask and the TAT (turn around time) compared to when the double exposure of the first island pattern images 21 and the second island pattern images 22 is performed using separate masks (reticles).

Although the case where three columns of the multiple first island pattern images 21 are exposure-transferred onto the resist film 14 is shown in the description recited above, similarly to the first embodiment, a pattern in which two columns of the multiple first island pattern images 21 are transferred onto the resist film 14 may be formed in the mask 60. Further, a pattern in which pattern images similar to those of the second embodiment and/or the third embodiment are transferred onto the resist film 14 by sliding the mask 60 can be made on the top and bottom of one mask 60.

Sixth Embodiment

Figure 15:
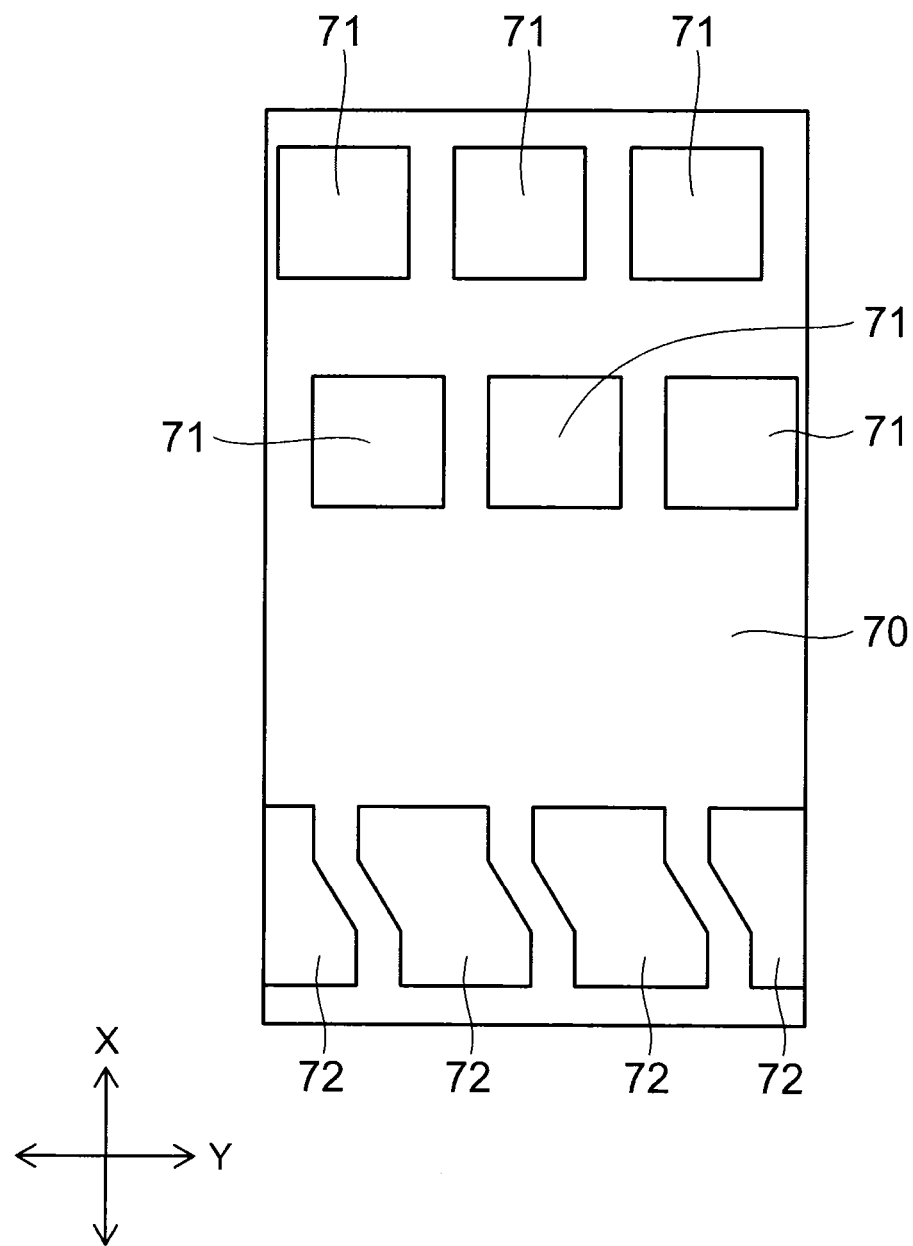
FIGS. 15 to 17 are schematic plan views showing a patterning method of a sixth embodiment.
Figure 16:
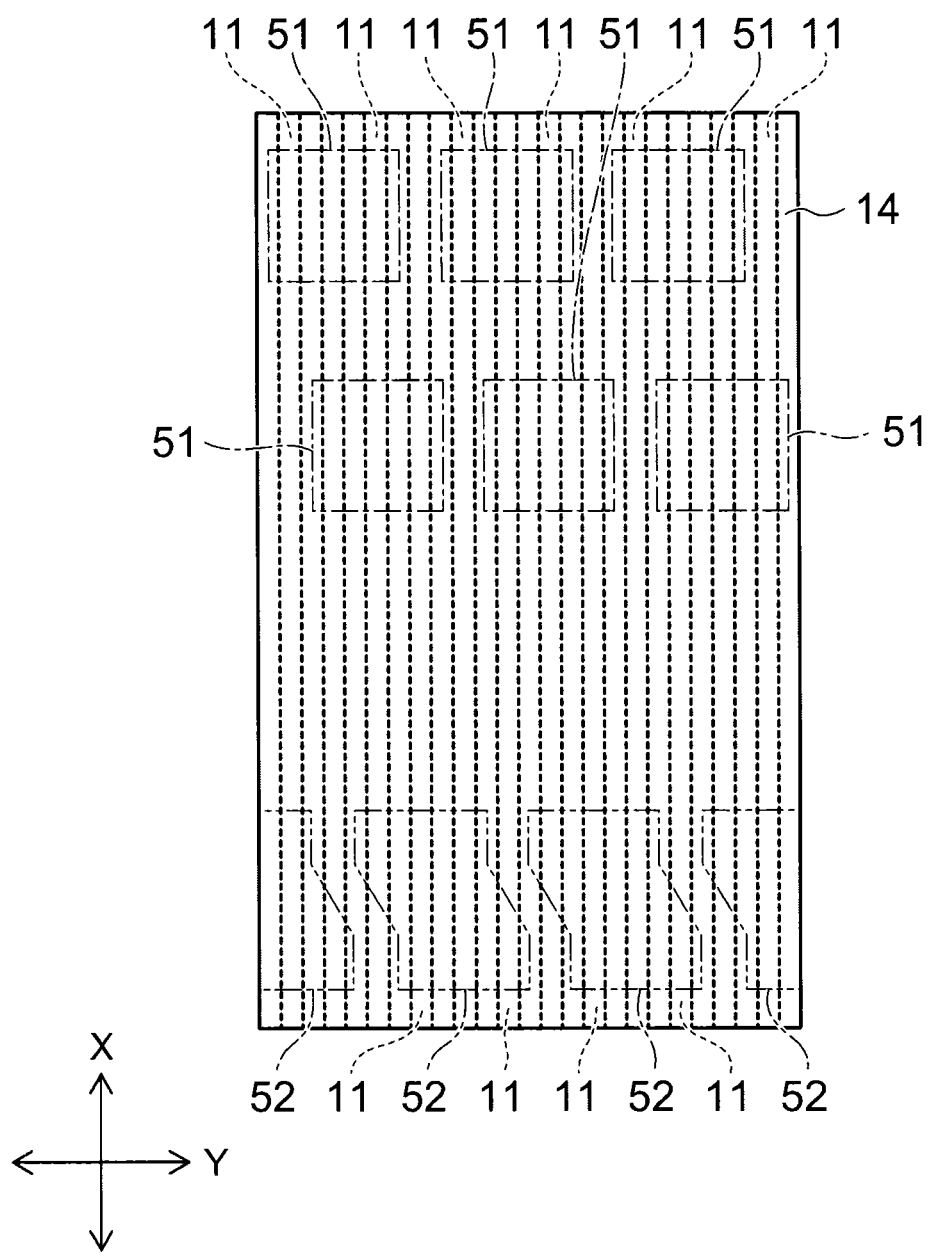
Figure 17:
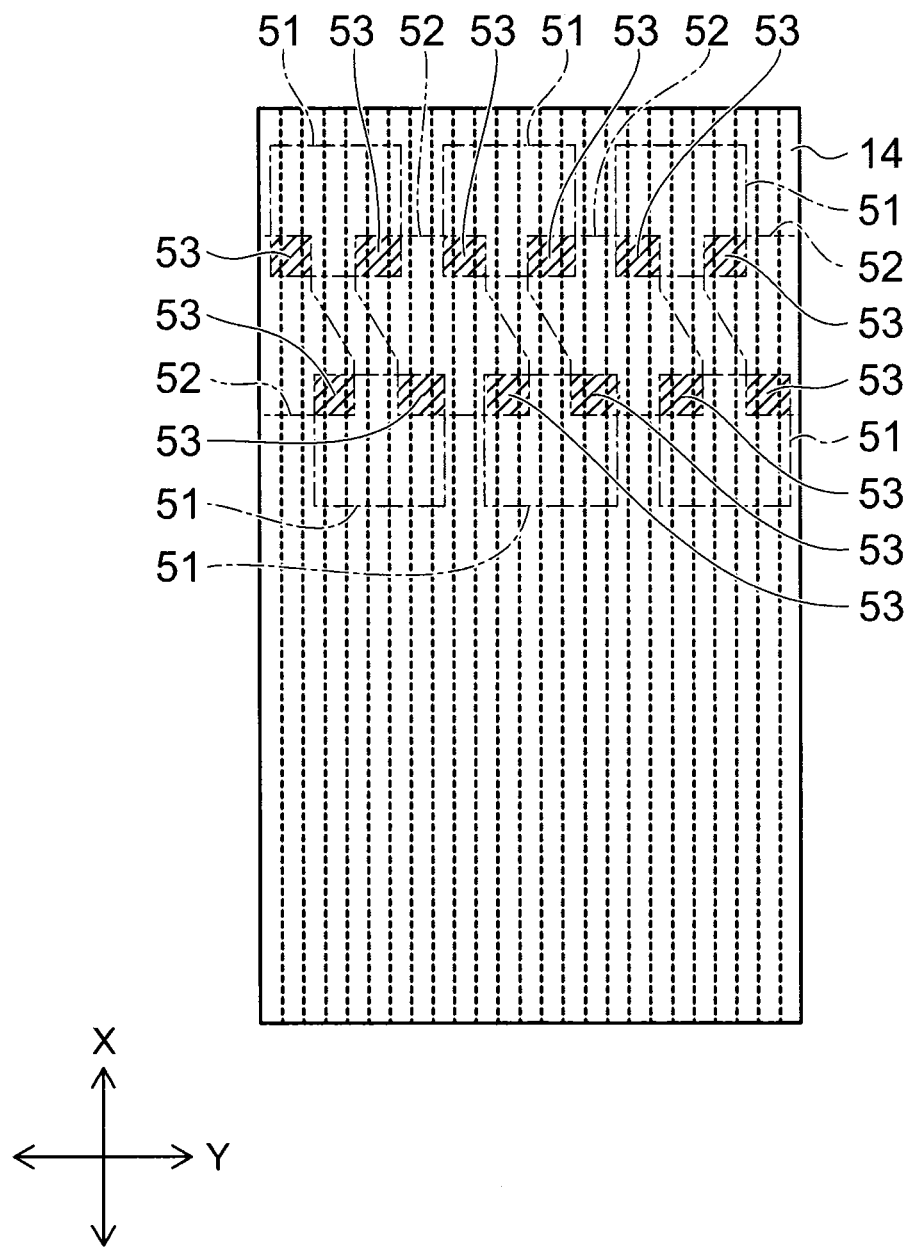

FIGS. 15 to 17 are schematic plan views showing a patterning method of a sixth embodiment.

In the sixth embodiment, the first pattern image 51 and the second pattern image 52 of the fourth embodiment described above are exposure-transferred onto the resist film 14 using a mask (a reticle) 70 shown in FIG. 15.

As shown in FIG. 15, multiple first island patterns 71 and multiple second island patterns 72 are formed in the mask 70.

The first island patterns 71 are patterns for exposure-transferring the first island pattern images 51; and the second island patterns 72 are patterns for exposure-transferring the second island pattern images 52. In other words, the patterns 71 for exposure-transferring the first island pattern images 51 and the patterns 72 for exposure-transferring the second island pattern images 52 are formed in the same mask 70.

The multiple first island patterns 71 have two columns of the multiple first island patterns 71 arranged in the Y direction; and the Y-direction positions of the columns are shifted from each other. In other words, the multiple first island patterns 71 have a staggered arrangement.

The multiple second island patterns 72 are arranged in only one column in the Y direction.

Although the configuration schematically shown in FIG. 15 is a configuration in which the configuration of the first island pattern 71 and the configuration of the second island pattern 72 are matched respectively to the configurations of the first island pattern image 51 and the second island pattern image 52 which are the transfer images, strictly speaking, the pattern configuration on the mask 70 is corrected by OPC (optical proximity correction), etc.

FIG. 16 shows the first exposure process onto the resist film 14.

The first island patterns 71 formed in the mask 70 are exposure-transferred onto the resist film 14 as the first island pattern images 51; and the second island patterns 72 formed in the same mask 70 are exposure-transferred onto the resist film 14 as the second island pattern images 52.

The multiple first island pattern images 51 have two columns of the multiple first island pattern images 51 arranged in the Y direction; and the Y-direction positions of the columns are shifted from each other. In other words, the multiple first island pattern images 51 have a staggered arrangement.

The multiple second island pattern images 52 are arranged in only one column in the Y direction.

The first island pattern images 51 and the second island pattern images 52 do not overlap in the first exposure.

Then, the second island patterns 72 formed in the mask 70 are exposure-transferred onto the resist film 14 as the second island pattern images 52 by overlapping a portion of the first island pattern images 51 exposure-transferred in the first exposure by sliding the mask 70 relatively to the resist film 14 in the X direction from the first exposure position.

In FIG. 17, the regions 53 where the first island pattern images 51 and the second island pattern images 52 overlap are illustrated by the diagonal lines.

Similarly to the fourth embodiment, four first island pattern images 51 are disposed around one second island pattern image 52; and a corner portion of each of the four first island pattern images 51 around the one second island pattern image 52 overlaps the one second island pattern image 52. Specifically, the two corner portions formed at one X-direction end portion of each of the second island pattern images 52 respectively overlap corner portions of two first island pattern images 51 adjacent to each other in the Y direction. The two corner portions formed at the other X-direction end portion of each of the second island pattern images 52 respectively overlap corner portions of two first island pattern images 51 adjacent to each other in the Y direction in a column different from that of the two first island pattern images 51 recited above.

The regions where the first island pattern images 51 are exposure-transferred and the regions where the second island pattern images 52 are exposure-transferred are unexposed regions. The entire surface of the region including the unexposed regions due to the second island pattern images 52 transferred in the first exposure shown in FIG. 16 is exposed in the second exposure shown in FIG. 17. For the unexposed regions due to the first island pattern images 51 transferred in the first exposure shown in FIG. 16, the regions other than the regions 53 overlapped by the second island pattern images 52 are exposed in the second exposure shown in FIG. 17.

Accordingly, after the two exposures end, the unexposed regions of the region of the resist film 14 shown in FIG. 17 are only the regions 53 where the first island pattern images 51 and the second island pattern images 52 overlap.

Each of the regions 53 is positioned on a different active region 11. The pitch of the regions 53 in the Y direction is larger than the pitch of the active regions 11 in the Y direction.

Hereinafter, the processes progress similarly to those of the fourth embodiment; and after the PEB (post exposure bake), the resist film 14 is developed using, for example, a non-polar organic solvent.

By the developing, the regions 53 which are the unexposed regions where the first island pattern images 51 and the second island pattern images 52 overlap are selectively removed; and the multiple holes 54 are made in the resist film 14 as shown in FIG. 9.

According to the sixth embodiment, one common mask 70 is used when performing the two exposure-transfers for forming the regions 53 where the first island pattern images 51 and the second island pattern images 52 overlap.

Further, because the alignment of the second exposure can be performed by sliding the mask 70 relatively to the resist film 14 in only one direction (the X direction) after the first exposure, the positional precision of the overlapping of the first island pattern images 51 and the second island pattern images 52 can be increased.

Accordingly, according to the sixth embodiment, it is possible to reduce the cost of making the mask and the TAT (turn around time) compared to when the double exposure of the first island pattern images 51 and the second island pattern images 52 is performed using separate masks (reticles).

In the embodiments described above, the resist film 14 is not limited to being a negative type, and a positive resist film 14 can be used; and the first island pattern images 21, 31, 41, and 51 and the second island pattern images 22, 32, 42, and 52 may be exposed regions rather than unexposed regions. In such a case, the first exposure amount and the second exposure amount are controlled such that only the regions 23, 33, 43, and 53 that are subject to two exposures where the first island pattern images 21, 31, 41, and 51 and the second island pattern images 22, 32, 42, and 52 overlap are dissolved by the developing liquid.

The patterning method of the embodiments described above is not limited to the manufacture of semiconductor devices and is applicable also to the manufacture of, for example, liquid crystal display apparatuses.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modification as would fall within the scope and spirit of the inventions.

What is claimed is:

1. A patterning method, comprising:
exposure-transferring a plurality of first island pattern images and a plurality of second island pattern images onto a resist film formed above a plurality of line patterns extending in a first direction and arranged in a second direction orthogonal to the first direction, each of the plurality of first island pattern images having a configuration having a contour line or a major axis extending in a third direction tilted with respect to the first direction and the second direction, the plurality of first island pattern images having a staggered arrangement, each of the plurality of second island pattern images having a configuration having a contour line or a major axis extending in a fourth direction tilted with respect to the first direction and the second direction, the plurality of second island pattern images having a staggered arrangement, the first island pattern images and the second island pattern images being continuous in the first direction by a portion of each of the second island pattern images overlapping one of the first island pattern images; and
developing the resist film to make a plurality of holes respectively in regions where the first island pattern images and the second island pattern images overlap, the plurality of holes being positioned above the line patterns, a pitch of the plurality of holes in the second direction being larger than a pitch of the plurality of line patterns in the second direction.

2. The patterning method according to claim 1, wherein end portions of the first island pattern images in the third direction overlap end portions of the second island pattern images in the fourth direction.

3. The patterning method according to claim 1, wherein the first island pattern images and the second island pattern images are congruent figures.

4. The patterning method according to claim 1, wherein the first island pattern images and the second island pattern images are parallelograms.

5. The patterning method according to claim 1, wherein the first island pattern images and the second island pattern images are ellipses.

6. The patterning method according to claim 1, wherein a point on a contour of the second island pattern image having a portion overlapping the first island pattern image is separated from another first island pattern image adjacent to the first island pattern image in the second direction, the point on the contour of the second island pattern image being where a distance from the point on the contour of the second island pattern image to a straight line connecting a center position of the first island pattern image to a center position of the second island pattern image in a direction perpendicular to the straight line is a maximum.

7. The patterning method according to claim 1 wherein, for three line patterns including the line pattern positioned under the region where the first island pattern image and the second island pattern image overlap and two adjacent line patterns provided on either side of the line pattern in the second direction, the first island pattern image and the second island pattern image belonging to one column overlap above the adjacent line pattern on one side in the second direction, and the first island pattern image and the second island pattern image belonging to another column overlap above the adjacent line pattern on the other side in the second direction.

8. The patterning method according to claim 1, wherein two of the line patterns are positioned under a region between the holes adjacent to each other in the second direction.

9. The patterning method according to claim 1, wherein the third direction and the fourth direction are substantially parallel.

10. The patterning method according to claim 1, wherein
a plurality of first island patterns formed in a mask is exposure-transferred onto the resist film as the plurality of first island pattern images, and
a plurality of second island patterns formed in the same mask is exposure-transferred onto the resist film as the second island pattern images by sliding the mask relatively to the resist film in the first direction to overlay the portion of each of the second island pattern images onto one of the first island pattern images.

11. The patterning method according to claim 1, wherein the resist film is a negative resist film, and
the regions where the first island pattern images and the second island pattern images overlap are unexposed regions.

12. The patterning method according to claim 1, wherein three columns of a plurality of the holes arranged in the second direction are formed.

13. A patterning method, comprising:
exposure-transferring a plurality of first island pattern images and a plurality of second island pattern images onto a resist film formed above a plurality of line patterns extending in a first direction and arranged in a second direction orthogonal to the first direction, the plurality of first island pattern images having a staggered arrangement, the plurality of second island pattern images being arranged in the second direction, the first island pattern images and the second island pattern images being continuous in the first direction and the second direction by each of the second island pattern images having portions overlapping each of a pair of the first island pattern images adjacent to each other in the second direction; and
developing the resist film to make a plurality of holes respectively in regions where the first island pattern images and the second island pattern images overlap, the plurality of holes being positioned above the line patterns, a pitch of the plurality of holes in the second direction being larger than a pitch of the plurality of line patterns in the second direction.

14. The patterning method according to claim 13, wherein a portion of each of four different first island pattern images around one of the second island pattern images overlaps the one of the second island pattern images.

15. The patterning method according to claim 13, wherein each of the second island pattern images has a contour line extending in a direction tilted with respect to the first direction and the second direction.

16. The patterning method according to claim 13, wherein one of the first island pattern image overlaps three of the line patterns arranged in the second direction.

17. The patterning method according to claim 13, wherein one of the line patterns is positioned under a region between the holes adjacent to each other in the second direction.

18. The patterning method according to claim 13, wherein
a plurality of first island patterns formed in a mask is exposure-transferred onto the resist film as the plurality of first island pattern images, and
a plurality of second island patterns formed in the same mask is exposure-transferred onto the resist film as the second island pattern images by sliding the mask relatively to the resist film in the first direction to overlay the portions of each of the second island pattern images onto a portion of each of the pair of the first island pattern images respectively.

19. The patterning method according to claim 13, wherein the resist film is a negative resist film, and
the regions where the first island pattern images and the second island pattern images overlap are unexposed regions.

20. The patterning method according to claim 13, wherein two columns of a plurality of the holes arranged in the second direction are formed.

* * * * *